United States Patent
Kang

(10) Patent No.: US 11,152,939 B2
(45) Date of Patent: Oct. 19, 2021

(54) SEMICONDUCTOR APPARATUS PERFORMING CALIBRATION OPERATION AND A SEMICONDUCTOR SYSTEM USING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/859,592

(22) Filed: Apr. 27, 2020

(65) Prior Publication Data

US 2021/0099172 A1    Apr. 1, 2021

(30) Foreign Application Priority Data

Sep. 26, 2019    (KR) .................. 10-2019-0118698

(51) Int. Cl.
*H03K 19/00* (2006.01)
*H03K 19/0185* (2006.01)

(52) U.S. Cl.
CPC . *H03K 19/0005* (2013.01); *H03K 19/018578* (2013.01)

(58) Field of Classification Search
None
See application file for complete search history.

(56) References Cited

U.S. PATENT DOCUMENTS

| 9,118,313 | B2 | 8/2015 | Lee et al. |
| 2011/0291699 | A1 | 12/2011 | Cho |
| 2014/0002130 | A1* | 1/2014 | Jang ............... H03K 17/166 326/30 |

FOREIGN PATENT DOCUMENTS

| KR | 1020140058738 A | 5/2014 |
| KR | 1020180075198 A | 7/2018 |

\* cited by examiner

*Primary Examiner* — Jany Richardson
(74) *Attorney, Agent, or Firm* — William Park & Associates Ltd.

(57) ABSTRACT

A semiconductor apparatus includes a calibration circuit and a main driver. The calibration circuit is configured to generate a first calibration code when set to have a positive offset and generate a second calibration code when set to have a negative offset complementary to the positive offset. The main driver is configured to set a resistance value of the main driver based on the first and second calibration codes.

18 Claims, 9 Drawing Sheets

SEMICONDUCTOR APPARATUS PERFORMING CALIBRATION OPERATION AND A SEMICONDUCTOR SYSTEM USING THE SAME

CROSS-REFERENCES TO RELATED APPLICATION

The present application claims priority under 35 U.S.C. § 119(a) to Korean application number 10-2019-0118698, filed on Sep. 26, 2019, in the Korean Intellectual Property Office, which is incorporated herein by reference in its entirety as set forth in full.

BACKGROUND

1. Technical Field

Various embodiments generally relate to an integrated circuit technology, and more particularly, to a semiconductor apparatus and a semiconductor system.

2. Related Art

Electronic devices, such as computer systems, include many electronic elements. Semiconductor apparatuses configured as a computer system may include a data transmission device for transmitting data. As the operation speed of a semiconductor apparatus improves and less power is consumed within the semiconductor apparatus, a transmitted signal may be distorted due to external noise and mismatched impedances between the semiconductor apparatus communicating with another semiconductor apparatus. Therefore, semiconductor apparatuses may perform an operation of impedance or resistance matching of the data transmission device.

Accordingly, a semiconductor apparatus generally includes an on-die termination circuit configured to perform impedance matching for precise signal transmission. Further, a semiconductor apparatus should correct, for precise impedance matching, termination resistance according to change of process, voltage and temperature (PVT). In general, a memory device is electrically coupled to an external reference resistance and corrects an impedance value of the termination resistance through a calibration operation by utilizing the external reference resistance, which is generally referred to as a ZQ calibration operation.

SUMMARY

In an embodiment of the present disclosure, a semiconductor apparatus may include a calibration circuit and a main driver. The calibration circuit may include a comparator configured to compare a calibration voltage and a reference voltage to generate a comparison signal. The calibration circuit may be configured to generate a first calibration code based on the comparison signal when the comparator is set to have a positive offset and generate a second calibration code based on the comparison signal when the comparator is set to have a negative offset complementary to the positive offset. The main driver may be configured to set a resistance value of the main driver based on the first calibration code and the second calibration code.

In an embodiment of the present disclosure, a semiconductor apparatus may include a calibration circuit and a main driver. The calibration circuit may include a first comparator configured to compare a first calibration voltage and a first reference voltage to generate a first comparison signal and a second comparator configured to compare a second calibration voltage and a second reference voltage to generate a second comparison signal. The calibration circuit may be configured to generate a first pull-up calibration code based on the first comparison signal and a first pull-down calibration code based on the second comparison signal when the first comparator and the second comparator are set to have a positive offset, and generate a second pull-up calibration code based on the first comparison signal and a second pull-down calibration code based on the second comparison signal when the first comparator and the second comparator are set to have a negative offset complementary to the positive offset. The main driver may be configured to set a pull-up resistance value based on the first pull-up calibration code and the second pull-up calibration code and a pull-down resistance value based on the first pull-down calibration code and the second pull-down calibration code.

In an embodiment of the present disclosure, a semiconductor apparatus may include a calibration circuit and a main driver. The calibration circuit may include a comparator configured to compare a calibration voltage and a reference voltage to generate a comparison signal. The calibration circuit may be configured to generate a first calibration code based on the comparison signal when the comparator is set to have a positive offset, generate a second calibration code based on the comparison signal when the comparator is set to have a negative offset complementary to the positive offset, and generate a shifted calibration code by changing a value of the second calibration code based on a shifting control signal. The main driver may be configured to set a resistance value of the main driver based on the first calibration code and the shifted calibration code.

In an embodiment of the present disclosure, a semiconductor apparatus may include a calibration circuit and a main driver. The calibration circuit may include a comparator configured to compare a calibration voltage and a reference voltage to generate a comparison signal. The calibration circuit may be configured to generate a first calibration code based on the comparison signal when the comparator is set to have a positive offset, generate a second calibration code based on the comparison signal when the comparator is set to have a negative offset complementary to the positive offset, generate a shifted calibration code by changing a value of the second calibration code based on a shifting control signal, and generate an average calibration code having a code value corresponding to an average of code values of the first calibration code and the shifted calibration code. The main driver may be configured to set a resistance value of the main driver based on the average calibration code.

DETAILED DESCRIPTION

Figure 1:
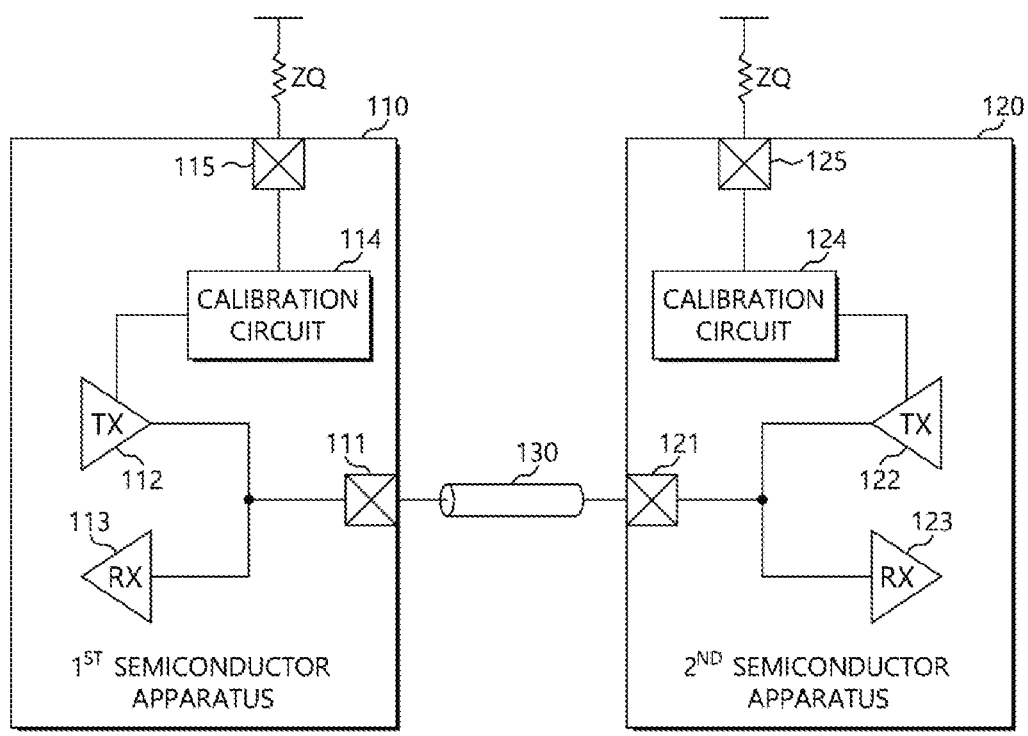
FIG. 1 is a diagram illustrating a configuration of a semiconductor system in accordance with an embodiment.

FIG. 1 is a diagram illustrating a configuration of a semiconductor system 100 in accordance with an embodiment. Referring to FIG. 1, the semiconductor system 100 may include a first semiconductor apparatus 110 and a second semiconductor apparatus 120. The first semiconductor apparatus 110 and the second semiconductor apparatus 120 may be electronic elements configured to communicate with each other. In an embodiment, the first semiconductor apparatus 110 may be a master device and the second semiconductor apparatus 120 may be a slave device configured to operate under the control of the first semiconductor apparatus 110. For example, the first semiconductor apparatus 110 may be a host device such as a processor or a controller and may include a central processing unit (CPU), a graphic processing unit (GPU), a multi-media processor (MMP), a digital signal processor, and a memory controller. Also, the first semiconductor apparatus 110 may be fabricated in a form of a System on Chip by combining processor chips (e.g., application processor (AP)) having various functions. The second semiconductor apparatus 120 may be a memory device and the memory device may include a volatile memory and a non-volatile memory. The volatile memory may include a static random access memory (static RAM: SRAM), a dynamic RAM (DRAM), and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The first semiconductor apparatus 110 and the second semiconductor apparatus 120 may be electrically coupled to each other through a signal transmission line 130. The first semiconductor apparatus 110 may include a pad 111 and may be electrically coupled to the signal transmission line 130 through the pad 111. The second semiconductor apparatus 120 may include a pad 121 and may be electrically coupled to the signal transmission line 130 through the pad 121. The signal transmission line 130 may be a channel, a link, or a bus. The first semiconductor apparatus 110 may include a transmission circuit (TX) 112 and a reception circuit (RX) 113. The transmission circuit 112 may transmit a signal, which is output from the first semiconductor apparatus 110, to the second semiconductor apparatus 120 through the signal transmission line 130. The reception circuit 113 may receive a signal transmitted from the second semiconductor apparatus 120 through the signal transmission line 130. The second semiconductor apparatus 120 may include a transmission circuit (TX) 122 and a reception circuit (RX) 123. The transmission circuit 122 may transmit a signal, which is output from the second semiconductor apparatus 120, to the first semiconductor apparatus 110 through the signal transmission line 130. The reception circuit 123 may receive a signal transmitted from the first semiconductor apparatus 110 through the signal transmission line 130. In an embodiment, the signal transmission line 130 may be a data transmission line and the signal transferred through the signal transmission line 130 may be data.

The first semiconductor apparatus 110 and the second semiconductor apparatus 120 may further include a calibration circuit 114 and a calibration circuit 124, respectively. Each of the calibration circuit 114 and the calibration circuit 124 may be electrically coupled to an external reference resistance ZQ and may perform a calibration operation. The calibration circuit 114 may be electrically coupled to the external reference resistance ZQ through a reference resistance pad 115 and the calibration circuit 124 may be electrically coupled to the external reference resistance ZQ through a reference resistance pad 125. The calibration circuit 114 and the calibration circuit 124 may set resistance values of the transmission circuit 112 and the transmission circuit 122 through the calibration operations, respectively. The calibration operations may be operations of setting resistance values of main drivers, which are included in the transmission circuit 112 and the transmission circuit 122, to become resistance values corresponding to the external reference resistance ZQ, respectively. For example, each of the resistance values of the transmission circuit 112 and the transmission circuit 122 may be set to any one among 48 ohms, 60 ohms, 120 ohms, 240 ohms, and so forth according to a result of the calibration operation. Each of the transmission circuit 112 and the transmission circuit 122 may have a pull-up resistance value and/or pull-up drivability for driving the signal transmission line 130 to a logic high level. Each of the transmission circuit 112 and the transmission circuit 122 may have a pull-down resistance value and/or pull-down drivability for driving the signal transmission line 130 to a logic low level. The pull-up resistance value and/or pull-up drivability and the pull-down resistance value and/or pull-down drivability of the transmission circuit 112 and the transmission circuit 122 may be set to correspond to the resistance value of the external reference resistance ZQ according to the results of the calibration operations of the calibration circuit 114 and the calibration circuit 124.

Figure 2:
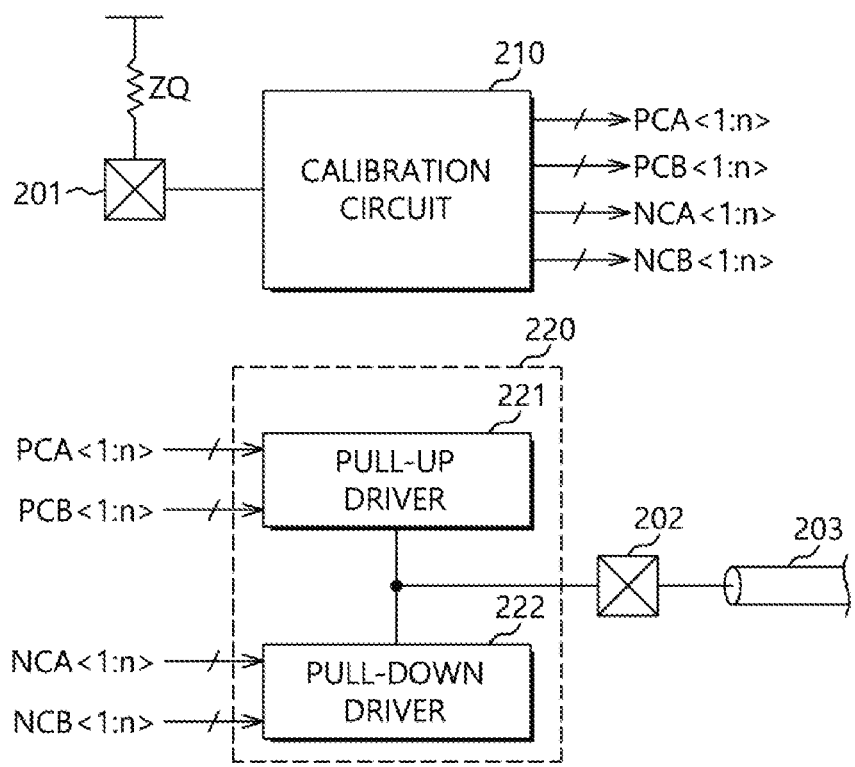
FIG. 2 is a diagram illustrating a configuration of a semiconductor apparatus in accordance with an embodiment.

FIG. 2 is a diagram illustrating a configuration of a semiconductor apparatus 200 in accordance with an embodiment. The semiconductor apparatus 200 may be representative of the first semiconductor apparatus 110 and the second semiconductor apparatus 120 illustrated in FIG. 1. The semiconductor apparatus 200 may include a calibration circuit 210 and a main driver 220. The calibration circuit 210 may be provided as at least one between the calibration circuit 114 and the calibration circuit 124 illustrated in FIG. 1. The main driver 220 may be provided as at least a part within the transmission circuit 112 and the transmission circuit 122 illustrated in FIG. 1. The calibration circuit 210 may generate calibration codes by performing a calibration operation. The calibration circuit 210 may be electrically coupled to the external reference resistance ZQ and may generate the calibration codes. The calibration circuit 210 may be electrically coupled to the external reference resistance ZQ through a reference resistance pad 201. The calibration operation performed by the calibration circuit 210 may be an operation of matching the resistance value of the main driver 220 to the resistance value of the external reference resistance ZQ.

The calibration codes may include pull-up calibration codes and pull-down calibration codes. The calibration circuit 210 may generate at least two pull-up calibration codes and at least two pull-down calibration code. The calibration circuit 210 may generate a first pull-up calibration code PCA<1:n> and a first pull-down calibration code NCA<1:n> ('n' is an integer greater than or equal to 2) when set to have a positive offset. The calibration circuit 210 may generate a second pull-up calibration code PCB<1:n> and a second pull-down calibration code NCB<1:n> when set to have a negative offset. The negative offset and the positive offset may have a complementary relationship.

The main driver 220 may receive the generated calibration codes from the calibration circuit 210 to set the resistance values of the main driver 220. The pull-up resistance value of the main driver 220 may be set on a basis of the pull-up calibration codes. The pull-down resistance value of the main driver 220 may be set on a basis of the pull-down calibration codes. The pull-up resistance value of the main driver 220 may be set on a basis of the first pull-up calibration code PCA<1:n> and the second pull-up calibration code PCB<1:n>. The pull-down resistance value of the main driver 220 may be set on a basis of the first pull-down calibration code NCA<1:n> and the second pull-down calibration code NCB<1:n>.

The main driver 220 may include a pull-up driver 221 and a pull-down driver 222. The pull-up driver 221 may receive the first pull-up calibration code PCA<1:n> and the second pull-up calibration code PCB<1:n> and may set the resistance value of the main driver 220 based on the first pull-up calibration code PCA<1:n> and the second pull-up calibration code PCB<1:n>. The pull-down driver 222 may receive the first pull-down calibration code NCA<1:n> and the second pull-down calibration code NCB<1:n> and may set the resistance value of the main driver 220 based on the first pull-down calibration code NCA<1:n> and the second pull-down calibration code NCB<1:n>. Each of the pull-up driver 221 and the pull-down driver 222 may be electrically coupled to a pad 202 and may be electrically coupled to a signal transmission line 203 through the pad 202.

Figure 3:
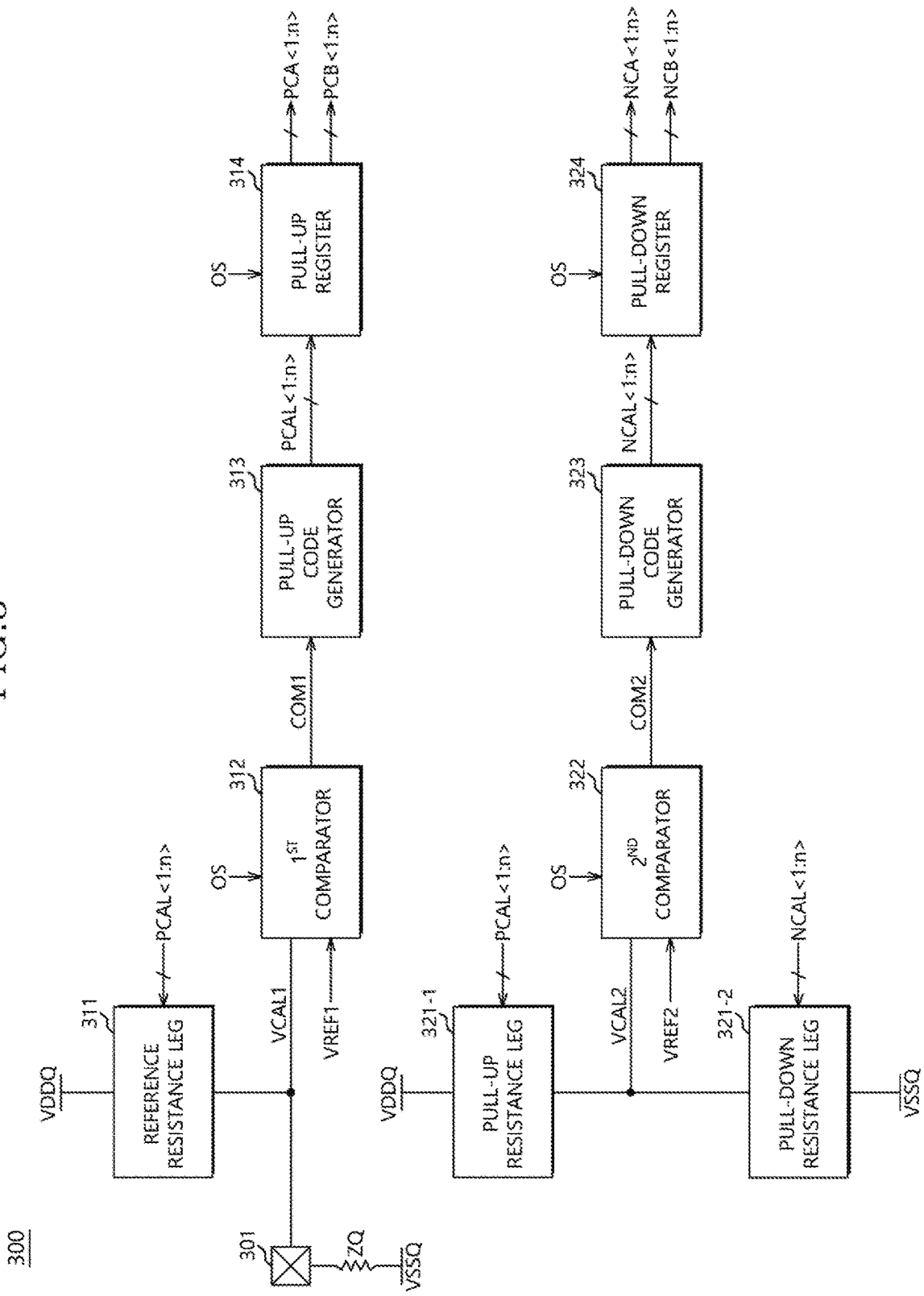
FIG. 3 is a diagram illustrating a configuration of a calibration circuit in accordance with an embodiment.

FIG. 3 is a diagram illustrating a configuration of a calibration circuit 300 in accordance with an embodiment. The calibration circuit 300 may be provided as the calibration circuit 210 illustrated in FIG. 2 and at least one between the calibration circuit 114 and the calibration circuit 124 illustrated in FIG. 1. Referring to FIG. 3, the calibration circuit 300 may include a comparator. The comparator may generate a comparison signal by comparing a calibration voltage and a reference voltage, and thus may allow the calibration circuit 300 to perform a calibration operation. The comparator may be configured by a plurality of transistors and may have an offset due to process characteristics of the transistors. The calibration circuit 300 may set the comparator to have one between a positive offset and a negative offset. When the comparator is set to have a positive offset, the calibration circuit 300 may generate the first calibration codes based on the comparison signal. When the comparator is set to have a negative offset, the calibration circuit 300 may generate the second calibration codes based on the comparison signal.

The calibration circuit 300 may include a reference resistance leg 311, a first comparator 312, a pull-up code generator 313, and a pull-up register 314. The reference resistance leg 311 may be electrically coupled to the external reference resistance ZQ through a reference resistance pad 301. The reference resistance leg 311 may be electrically coupled between a pad, to which a first power voltage VDDQ is supplied, and the reference resistance pad 301. The external reference resistance ZQ may be electrically coupled between a pad, to which a second power voltage VSSQ is supplied, and the reference resistance pad 301. The first power voltage VDDQ may have a higher level than the second power voltage VSSQ. In an embodiment, the reference resistance leg 311 may be modified to be electrically coupled between the pad, to which the second power voltage VSSQ is supplied, and the reference resistance pad 301. In an embodiment, the external reference resistance ZQ may be modified to be electrically coupled between the pad, to which the first power voltage VDDQ is supplied, and the reference resistance pad 301. The reference resistance leg 311 may receive a first resistance setting code PCAL<1:n>. A resistance value of the reference resistance leg 311 may be set on a basis of the first resistance setting code PCAL<1:n>. The reference resistance leg 311 may be electrically coupled to the external reference resistance ZQ and may generate a first calibration voltage VCAL1. A voltage level of the first calibration voltage VCAL1 may be determined according to a ratio between the resistance value of the reference resistance leg 311 and the resistance value of the external reference resistance ZQ.

The first comparator 312 may receive the first calibration voltage VCAL1 and a first reference voltage VREF1. The first reference voltage VREF1 may have a voltage level corresponding to a target voltage level of the first calibration voltage VCAL1. For example, in order to set the resistance value of the reference resistance leg 311 to be the same as the resistance value of the external reference resistance ZQ, the target voltage level may be an average of the first power voltage VDDQ and the second power voltage VSSQ and the first reference voltage VREF1 may have the voltage level corresponding to the average. The first comparator 312 may generate a first comparison signal COM1 by comparing the first calibration voltage VCAL1 and the first reference voltage VREF1. The first comparator 312 may receive an offset setting signal OS. The first comparator 312 may be configured to have the positive offset when the offset setting signal OS has a first logic level. The first comparator 312 may be configured to have the negative offset when the offset setting signal OS has a second logic level. The positive offset and the negative offset may be set by switching the signals provided to the first comparator 312 or switching the signals generated by the first comparator 312. The positive offset and the negative offset may also be set by switching nodes electrically coupled to an input node and an output node included in the first comparator 312. Further description will follow below. The first comparator 312 may generate the first comparison signal COM1 of a first logic level when the first calibration voltage VCAL1 has a higher voltage level than the first reference voltage VREF1. The first comparator 312 may generate the first comparison signal COM1 of a second logic level when the first calibration voltage VCAL1 has a lower voltage level than the first reference voltage VREF1.

The pull-up code generator 313 may receive the first comparison signal COM1 and may generate the first resistance setting code PCAL<1:n> based on the first comparison signal COM1. For example, when the first comparison signal COM1 has a first logic level, the pull-up code generator 313 may increase the resistance value of the reference resistance leg 311 by increasing the value of the first resistance setting code PCAL<1:n>. For example, when the first comparison signal COM1 has a second logic level, the pull-up code generator 313 may decrease the resistance value of the reference resistance leg 311 by decreasing the value of the first resistance setting code PCAL<1:n>.

The pull-up register 314 may store the first pull-up calibration code PCA<1:n> and the second pull-up calibration code PCB<1:n> by receiving the first resistance setting code PCAL<1:n>. When the first comparator 312 is set to have the positive offset, the pull-up register 314 may store the first resistance setting code PCAL<1:n>, which is generated by the pull-up code generator 313, as the first pull-up calibration code PCA<1:n>. When the first comparator 312 is set to have the negative offset, the pull-up register 314 may store the first resistance setting code PCAL<1:n>, which is generated by the pull-up code generator 313, as the second pull-up calibration code PCB<1:n>. The pull-up register 314 may receive the offset setting signal OS. When the offset setting signal OS has a first logic level, the pull-up register 314 may store the first resistance setting code PCAL<1:n> as the first pull-up calibration code PCA<1:n>. When the offset setting signal OS has a second logic level, the pull-up register 314 may store the first resistance setting code PCAL<1:n> as the second pull-up calibration code PCB<1:n>. In order to set the pull-up resistance value of the main driver 220, the pull-up register 314 may output the first pull-up calibration code PCA<1:n> and the second pull-up calibration code PCB<1:n> to the main driver 220.

The calibration circuit 300 may further include a pull-up resistance leg 321-1, a pull-down resistance leg 321-2, a second comparator 322, a pull-down code generator 323 and a pull-down register 324. The pull-up resistance leg 321-1 may receive the first resistance setting code PCAL<1:n> and may set the resistance value thereof based on the first resistance setting code PCAL<1:n>. The pull-up resistance leg 321-1 may be a copy of the reference resistance leg 311 and may have substantially the same configuration as the reference resistance leg 311. The pull-up resistance leg 321-1 may be electrically coupled to the pad, to which the first power voltage VDDQ is supplied. The pull-down resistance leg 321-2 may be electrically coupled between the pad, to which the second power voltage VSSQ is supplied, and the pull-up resistance leg 321-1. The pull-down resistance leg 321-2 may receive a second resistance setting code NCAL<1:n>. The resistance value of the pull-down resistance leg 321-2 may be determined on a basis of the second resistance setting code NCAL<1:n>. The pull-down resistance leg 321-2 may be electrically coupled to the pull-up resistance leg 321-1 and may generate a second calibration voltage VCAL2. A voltage level of the second calibration voltage VCAL2 may be determined according to a ratio between the resistance value of the pull-up resistance leg 321-1 and the resistance value of the pull-down resistance leg 321-2.

The second comparator 322 may receive the second calibration voltage VCAL2 and a second reference voltage VREF2. The second reference voltage VREF2 may have a voltage level corresponding to a target voltage level of the second calibration voltage VCAL2. The second reference voltage VREF2 may have substantially the same voltage level as the first reference voltage VREF1. In an embodiment, the second reference voltage VREF2 may have different voltage level from the first reference voltage VREF1. For example, in order to set the resistance values of a pull-up driver and a pull-down driver to be different from each other according to a channel characteristic of a signal transmission line electrically coupled to a main driver, the second reference voltage VREF2 may have different voltage level from the first reference voltage VREF1. The second comparator 322 may generate a second comparison signal COM2 by comparing the second calibration voltage VCAL2 and the second reference voltage VREF2. The second comparator 322 may receive the offset setting signal OS. The second comparator 322 may be configured to have the positive offset when the offset setting signal OS has a first logic level. The second comparator 322 may be configured to have the negative offset when the offset setting signal OS has a second logic level. The positive offset and the negative offset may be set by switching the signals provided to the second comparator 322 or switching the signals generated by the second comparator 322. The positive offset and the negative offset may also be set by switching nodes electrically coupled to an input node and an output node included in the second comparator 322. The second comparator 322 may generate the second comparison signal COM2 of a first logic level when the second calibration voltage VCAL2 has a higher voltage level than the second reference voltage VREF2. The second comparator 322 may generate the second comparison signal COM2 of a second logic level when the second calibration voltage VCAL2 has a lower voltage level than the second reference voltage VREF2.

The pull-down code generator 323 may receive the second comparison signal COM2 and may generate the second resistance setting code NCAL<1:n> based on the second comparison signal COM2. For example, when the second comparison signal COM2 has a first logic level, the pull-down code generator 323 may decrease the resistance value of the pull-down resistance leg 321-2 by increasing the value of the second resistance setting code NCAL<1:n>. For example, when the second comparison signal COM2 has a second logic level, the pull-down code generator 323 may increase the resistance value of the pull-down resistance leg 321-2 by decreasing the value of the second resistance setting code NCAL<1:n>.

The pull-down register 324 may store the first pull-down calibration code NCA<1:n> and the second pull-down calibration code NCB<1:n> by receiving the second resistance setting code NCAL<1:n>. When the second comparator 322 is set to have the positive offset, the pull-down register 324 may store the second resistance setting code NCAL<1:n>, which is generated by the pull-down code generator 323, as the first pull-down calibration code NCA<1:n>. When the second comparator 322 is set to have the negative offset, the pull-down register 324 may store the second resistance setting code NCAL<1:n>, which is generated by the pull-down code generator 323, as the second pull-down calibration code NCB<1:n>. The pull-down register 324 may receive the offset setting signal OS. When the offset setting signal OS has a first logic level, the pull-down register 324 may store the second resistance setting code NCAL<1:n> as the first pull-down calibration code NCA<1:n>. When the offset setting signal OS has a second logic level, the pull-down register 324 may store the second resistance setting code NCAL<1:n> as the second pull-down calibration code NCB<1:n>. In order to set the pull-down resistance value of the main driver 220, the pull-down register 324 may output the first pull-down calibration code NCA<1:n> and the second pull-down calibration code NCB<1:n> to the main driver 220.

Figure 4:
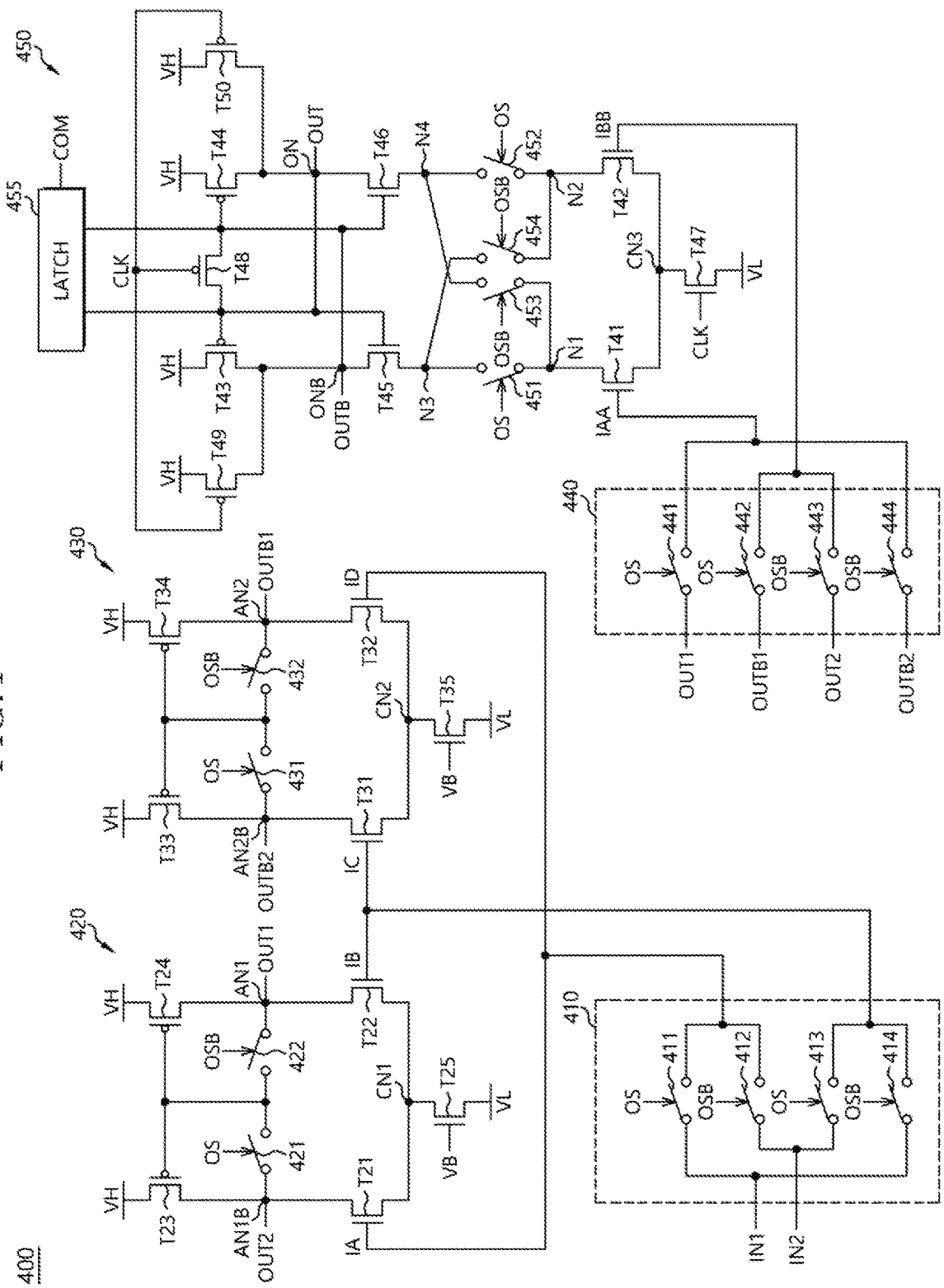
FIG. 4 is a diagram illustrating a configuration of a comparator in accordance with an embodiment.

FIG. 4 is a diagram illustrating a configuration of a comparator 400 in accordance with an embodiment. Referring to FIG. 4, the comparator 400 may include a first input node IA, a second input node IB, a third input node IC, a fourth input node ID, first differential output nodes AN1 and AN1B, and second differential output nodes AN2 and AN2B. The comparator 400 may generate an amplified signal pair by differentially amplifying signals received through the first input node IA and the second input node IB and may output the amplified signal pair through the first differential output nodes AN1 and AN1B. The comparator 400 may generate an amplified signal pair by differentially amplifying signals received through the third input node IC and the fourth input node ID and may output the amplified signal pair through the second differential output nodes AN2 and AN2B. The comparator 400 may receive a first input signal IN1 and a second input signal IN2. The comparator 400 may be set to have one between the positive offset and the negative offset based on the offset setting signal OS. When the offset setting signal OS has a first logic level, the comparator 400 may receive the first input signal IN1 through the first input node IA and the fourth input node ID and may receive the second input signal IN2 through the second input node IB and the third input node IC. The comparator 400 may generate a comparison signal COM based on one between the amplified signal pair output through the first differential output nodes AN1 and AN1B and one between the amplified signal pair output through the second differential output nodes AN2 and AN2B. When the offset setting signal OS has a second logic level, the comparator 400 may receive the first input signal IN1 through the second input node IB and the third input node IC and may receive the second input signal IN2 through the first input node IA and the fourth input node ID. The comparator 400 may generate the comparison signal COM based on the other one between the amplified signal pair output through the first differential output nodes AN1 and AN1B and the other one between the amplified signal pair output through the second differential output nodes AN2 and AN2B.

The comparator 400 may further include an input signal selector 410, a first amplifier 420, a second amplifier 430, an amplified signal selector 440, and a latched comparator 450. The first amplifier 420 may include the first input node IA, the second input node IB, and the first differential output nodes AN1 and AN1B. The second amplifier 430 may include the third input node IC, the fourth input node ID, and the second differential output nodes AN2 and AN2B. The input signal selector 410 may receive the first input signal IN1, the second input signal IN2, and the offset setting signal OS. When the offset setting signal OS has a first logic level, the input signal selector 410 may output the first input signal IN1 to the first input node IA and the fourth input node ID and may output the second input signal IN2 to the second input node IB and the third input node IC. When the offset setting signal OS has a second logic level, the input signal selector 410 may output the first input signal IN1 to the second input node IB and the third input node IC and may output the second input signal IN2 to the first input node IA and the fourth input node ID.

The first amplifier 420 may receive the output of the input signal selector 410 through the first input node IA and the second input node IB. The first amplifier 420 may generate a first amplified signal pair OUT1 and OUT2 by differentially amplifying the signals provided through the first input node IA and the second input node IB. The first amplifier 420 may be electrically coupled between a node, to which a high voltage VH is supplied, and a node, to which a low voltage VL is supplied. The first amplifier 420 may change the voltage levels of the first differential output nodes AN1 and AN1B based on the signals provided through the first input node IA and the second input node IB. The first amplified signal pair OUT1 and OUT2 may be respectively output through the first differential output nodes AN1 and AN1B. The high voltage VH may have a higher voltage level than the low voltage VL. The high voltage VH may have a voltage level that is high enough for the first amplified signal pair OUT1 and OUT2, which is output through the first differential output nodes AN1 and AN1B, to have a logic high level. The low voltage VL may have a voltage level that is low enough for the first amplified signal pair OUT1 and OUT2, which is output through the first differential output nodes AN1 and AN1B, to have a logic low level. The first amplifier 420 may further receive the offset setting signal OS. The first amplifier 420 may be configured to have a plurality of offsets based on the offset setting signal OS.

The second amplifier 430 may receive the output of the input signal selector 410 through the third input node IC and the fourth input node ID. The second amplifier 430 may generate a second amplified signal pair OUTB1 and OUTB2 by differentially amplifying the signals provided through the third input node IC and the fourth input node ID. The second amplifier 430 may be electrically coupled between the node, to which the high voltage VH is supplied, and the node, to which the low voltage VL is supplied. The second amplifier 430 may change the voltage levels of the second differential output nodes AN2 and AN2B based on the signals provided through the third input node IC and the fourth input node ID. The second amplified signal pair OUTB1 and OUTB2 may be respectively output through the second differential output nodes AN2 and AN2B. The second amplifier 430 may further receive the offset setting signal OS. The second amplifier 430 may be configured to have a plurality of offsets based on the offset setting signal OS.

The amplified signal selector 440 may receive the first amplified signal pair OUT1 and OUT2, the second amplified signal pair OUTB1 and OUTB2, and the offset setting signal OS. The amplified signal selector 440 may selectively output one between the first amplified signal pair OUT1 and OUT2 and one between the second amplified signal pair OUTB1 and OUTB2 based on the offset setting signal OS. When the offset setting signal OS has a first logic level, the amplified signal selector 440 may output one between the first amplified signal pair OUT1 and OUT2 and one between the second amplified signal pair OUTB1 and OUTB2. When the offset setting signal OS has a second logic level, the amplified signal selector 440 may output the other one between the first amplified signal pair OUT1 and OUT2 and the other one between the second amplified signal pair OUTB1 and OUTB2.

The latched comparator 450 may receive the signal output from the amplified signal selector 440. The latched comparator 450 may generate an output signal pair OUT and OUTB by latching the signal output from the amplified signal selector 440 and may generate the comparison signal COM by latching the output signal pair OUT and OUTB. The latched comparator 450 may further receive a clock signal CLK and may operate in synchronization with the clock signal CLK. For example, the latched comparator 450 may precharge, when the clock signal CLK has a second logic level, the output signal pair OUT and OUTB. For example, the latched comparator 450 may change, when the clock signal CLK has a first logic level, the voltage levels of the output signal pair OUT and OUTB based on the signal output from the amplified signal selector 440. The latched comparator 450 may further receive the offset setting signal OS. The latched comparator 450 may be configured to have a plurality of offsets based on the offset setting signal OS.

The input signal selector 410 may include a first switch 411, a second switch 412, a third switch 413, and a fourth switch 414. The first switch 411 may receive the offset setting signal OS. The first switch 411 may output, when the offset setting signal OS has a first logic level, the first input signal IN1 through the first input node IA and the fourth input node ID. The second switch 412 may receive a complementary signal OSB of the offset setting signal OS. The second switch 412 may output, when the offset setting signal OS has a second logic level, the second input signal IN2 through the first input node IA and the fourth input node ID. The third switch 413 may receive the offset setting signal OS. The third switch 413 may output, when the offset setting signal OS has a first logic level, the second input signal IN2 through the second input node IB and the third input node IC. The fourth switch 414 may receive the complementary signal OSB of the offset setting signal OS. The fourth switch 414 may output, when the offset setting signal OS has a second logic level, the first input signal IN1 through the second input node IB and the third input node IC.

The first amplifier 420 may include a first transistor T21, a second transistor T22, a third transistor T23, a fourth transistor T24, a fifth transistor T25, a first switch 421, and a second switch 422. Each of the first transistor T21, the second transistor T22, and the fifth transistor T25 may be an N-channel MOS transistor. Each of the third transistor T23 and the fourth transistor T24 may be a P-channel MOS transistor. The gate of the first transistor T21 may be the first input node IA of the comparator 400. The gate of the second transistor T22 may be the second input node IB of the comparator 400. The first transistor T21 may be electrically coupled between a second amplification node AN1B and a first common node CN1. The second transistor T22 may be electrically coupled between a first amplification node AN1 and the first common node CN1. The first amplification node AN1 and the second amplification node AN1B may be the first differential output nodes AN1 and AN1B of the comparator 400. The first amplified signal pair OUT1 and OUT2 may be output through the first amplification node AN1 and the second amplification node AN1B. The first amplified signal OUT1 may be output through the first amplification node AN1. The complementary signal OUT2 of the first amplified signal OUT1 may be output through the second amplification node AN1B. The gate of the third transistor T23 may be electrically coupled between the node, to which the high voltage VH is supplied, and the second amplification node AN1B. The fourth transistor T24 may be electrically coupled between the node, to which the high voltage VH is supplied, and the first amplification node AN1. The gate of the fourth transistor T24 may be electrically coupled to the gate of the third transistor T23. The first switch 421 may be electrically coupled between the gates of the third transistor T23 and the fourth transistor T24 and the second amplification node AN1B. The first switch 421 may electrically couple, based on the offset setting signal OS, the gates of the third transistor T23 and the fourth transistor T24 to the second amplification node AN1B. For example, the first switch 421 may receive the offset setting signal OS. When the offset setting signal OS has a first logic level, the first switch 421 may electrically couple the gates of the third transistor T23 and the fourth transistor T24 to the second amplification node AN1B. The second switch 422 may be electrically coupled between the gates of the third transistor T23 and the fourth transistor T24 and the first amplification node AN1. The second switch 422 may electrically couple, based on the offset setting signal OS, the gates of the third transistor T23 and the fourth transistor T24 to the first amplification node AN1. For example, the second switch 422 may receive the complementary signal OSB of the offset setting signal OS. When the offset setting signal OS has a second logic level, the second switch 422 may electrically couple the gates of the third transistor T23 and the fourth transistor T24 to the first amplification node AN1. The fifth transistor T25 may be electrically coupled between the first common node CN1 and the node, to which the low voltage VL is suppled. The fifth transistor T25 may receive a bias voltage VB at its gate. The bias voltage VB may have a voltage level that is enough to turn on the fifth transistor T25 for activation of the first amplifier 420.

The second amplifier 430 may include a first transistor T31, a second transistor T32, a third transistor T33, a fourth transistor T34, a fifth transistor T35, a first switch 431, and a second switch 432. Each of the first transistor T31, the second transistor T32, and the fifth transistor T35 may be an N-channel MOS transistor. Each of the third transistor T33 and the fourth transistor T34 may be a P-channel MOS transistor. The gate of the first transistor T31 may be the third input node IC of the comparator 400. The gate of the second transistor T32 may be the fourth input node ID of the comparator 400. The first transistor T31 may be electrically coupled between a fourth amplification node AN2B and a second common node CN2. The second transistor T32 may be electrically coupled between a third amplification node AN2 and the second common node CN2. The third amplification node AN2 and the fourth amplification node AN2B may be the second differential output nodes AN2 and AN2B of the comparator 400. The second amplified signal pair OUTB1 and OUTB2 may be output through the third amplification node AN2 and the fourth amplification node AN2B. The second amplified signal OUTB1 may be output through the third amplification node AN2. The complementary signal OUTB2 of the second amplified signal OUTB1 may be output through the fourth amplification node AN2B. The gate of the third transistor T33 may be electrically coupled between the node, to which the high voltage VH is supplied, and the fourth amplification node AN2B. The fourth transistor T34 may be electrically coupled between the node, to which the high voltage VH is supplied, and the third amplification node AN2. The gate of the fourth transistor T34 may be electrically coupled to the gate of the third transistor T33. The first switch 431 may be electrically coupled between the gates of the third transistor T33 and the fourth transistor T34 and the fourth amplification node AN2B. The first switch 431 may electrically couple, based on the offset setting signal OS, the gates of the third transistor T33, and the fourth transistor T34 to the fourth amplification node AN2B. For example, the first switch 431 may receive the offset setting signal OS. When the offset setting signal OS has a first logic level, the first switch 431 may electrically couple the gates of the third transistor T33 and the fourth transistor T34 to the fourth amplification node AN2B. The second switch 432 may be electrically coupled between the gates of the third transistor T33 and the fourth transistor T34 and the third amplification node AN2. The second switch 432 may electrically couple, based on the offset setting signal OS, the gates of the third transistor T33 and the fourth transistor T34 to the third amplification node AN2. For example, the second switch 432 may receive the complementary signal OSB of the offset setting signal OS. When the offset setting signal OS has a second logic level, the second switch 432 may electrically couple the gates of the third transistor T33 and the fourth transistor T34 to the third amplification node AN2. The fifth transistor T35 may be electrically coupled between the second common node CN2 and the node, to which the low voltage VL is suppled. The fifth transistor T55 may receive the bias voltage VB at its gate.

The amplified signal selector 440 may include a first switch 441, a second switch 442, a third switch 443, and a fourth switch 444. The first switch 441 may receive the offset setting signal OS. The first switch 441 may output, when the offset setting signal OS has a first logic level, the first amplified signal OUT1 to a first input node IAA of the latched comparator 450. The second switch 442 may receive the offset setting signal OS. The second switch 442 may output, when the offset setting signal OS has a first logic level, the second amplified signal OUTB1 through a second input node IBB of the latched comparator 450. The third switch 443 may receive the complementary signal OSB of the offset setting signal OS. The third switch 443 may output, when the offset setting signal OS has a second logic level, the complementary signal OUT2 of the first amplified signal OUT1 to the second input node IBB of the latched comparator 450. The fourth switch 444 may receive the complementary signal OSB of the offset setting signal OS. The fourth switch 444 may output, when the offset setting signal OS has a second logic level, the complementary signal OUTB2 of the second amplified signal OUTB1 to the first input node IAA of the latched comparator 450.

The latched comparator 450 may include a first transistor T41, a second transistor T42, a third transistor T43, a fourth transistor T44, a fifth transistor T45, a sixth transistor T46, a seventh transistor T47, an eighth transistor T48, a ninth transistor T49, a tenth transistor T50, a first switch 451, a second switch 452, a third switch 453, a fourth switch 454, and a latch 455. Each of first transistor T41, the second transistor T42, the fifth transistor T45, the sixth transistor T46, and the seventh transistor T47 may be an N-channel MOS transistor. Each of the third transistor T43, the fourth transistor T44, the eighth transistor T48, the ninth transistor T49, and the tenth transistor T50 may be a P-channel MOS transistor. The first transistor T41 may be electrically coupled between a first node N1 and a third common node CN3. The gate of the first transistor T41 may be the first input node IAA of the latched comparator 450. The second transistor T42 may be electrically coupled between a second node N2 and the third common node CN3. The gate of the second transistor T42 may be the second input node IBB of the latched comparator 450. The third transistor T43 may be electrically coupled between the node, to which the high voltage VH is supplied, and a second output node ONB. The gate of the third transistor T43 may be electrically coupled to a first output node ON. The fourth transistor T44 may be electrically coupled between the node, to which the high voltage VH is supplied, and the first output node ON. The gate of the fourth transistor T44 may be electrically coupled to the second output node ONB. The fifth transistor T45 may be electrically coupled between the second output node ONB and a third node N3. The gate of the fifth transistor T45 may be electrically coupled to the first output node ON. The sixth transistor T46 may be electrically coupled between the first output node ON and a fourth node N4. The gate of the sixth transistor T46 may be electrically coupled to the second output node ONB. The seventh transistor T47 may be electrically coupled between the third node N3 and the node, to which the low voltage VL is supplied. The seventh transistor T47 may receive the clock signal CLK at its gate. The eighth transistor T48 may be electrically coupled between the gates of the third transistor T43 and the fourth transistor T44. The eighth transistor T48 may receive the clock signal CLK at its gate. The ninth transistor T49 may be electrically coupled between the node, to which the high voltage VH is supplied, and the second output node ONB. The ninth transistor T49 may receive the clock signal CLK at its gate. The tenth transistor T50 may be electrically coupled between the node, to which the high voltage VH is supplied, and the first output node ON. The tenth transistor T50 may receive the clock signal CLK at its gate.

The first switch 451 may be electrically coupled between the first node N1 and the third node N3. The first switch 451 may receive the offset setting signal OS. The first switch 451 may electrically couple, when the offset setting signal OS has a first logic level, the first node N1 and the third node N3. The second switch 452 may be electrically coupled between the second node N2 and the fourth node N4. The second switch 452 may receive the offset setting signal OS. The second switch 452 may electrically couple, when the offset setting signal OS has a first logic level, the second node N2 and the fourth node N4. The third switch 453 may be electrically coupled between the first node N1 and the fourth node N4. The third switch 453 may receive the complementary signal OSB of the offset setting signal OS. The third switch 453 may electrically couple, when the offset setting signal OS has a second logic level, the first node N1 and the fourth node N4. The fourth switch 454 may be electrically coupled between the second node N2 and the third node N3. The fourth switch 454 may receive the complementary signal OSB of the offset setting signal OS. The fourth switch 454 may electrically couple, when the offset setting signal OS has a second logic level, the second node N2 and the third node N3. The latch 455 may be electrically coupled to the first output node ON and the second output node ONB. The latch 455 may receive the output signal pair OUT and OUTB. The output signal OUT may be output through the first output node ON. The complementary signal OUTB of the output signal OUT may be output through the second output node ONB. The latch 455 may generate the comparison signal COM by latching the voltage levels of the output signal pair OUT and OUTB.

When the offset setting signal OS has a first logic level, the first switch 411 and the third switch 413 within the input signal selector 410 may be turned on; the first input signal IN1 may be input to the gate of the first transistor T21 within the first amplifier 420 and the gate of the second transistor T32 within the second amplifier 430; and the second input signal IN2 may be input to the gate of the second transistor T22 within the first amplifier 420 and the gate of the first transistor T31 within the second amplifier 430. The first switch 421 within the first amplifier 420 may electrically couple the gates of the third transistor T23 and the fourth transistor T24 to the second amplification node AN1B. The first switch 431 within the second amplifier 430 may electrically couple the gates of the third transistor T33 and the fourth transistor T34 to the fourth amplification node AN2B. The first amplifier 420 may generate the first amplified signal pair OUT1 and OUT2 by differentially amplifying the first input signal IN1 and the second input signal IN2. The first amplified signal pair may include a first output signal OUT1 and the complementary signal OUT2 of the first output signal OUT1. The second amplifier 430 may generate the second amplified signal pair OUTB1 and OUTB2 by differentially amplifying the first input signal IN1 and the second input signal IN2. The second amplified signal pair may include a second output signal OUTB1 and the complementary signal OUTB2 of the second output signal OUTB1.

When the offset setting signal OS has a first logic level, the first switch 441 and the second switch 442 within the amplified signal selector 440 may be turned on; the first output signal OUT1 may be output to the gate of the first transistor T41 within the latched comparator 450; and the second output signal OUTB1 may be output to the gate of the second transistor T42 within the latched comparator 450. Within the latched comparator 450, the first switch 451 may electrically couple the first node N1 to the third node N3 and the second switch 452 may electrically couple the second node N2 to the fourth node N4. At this time, the first amplifier 420, the second amplifier 430 and the latched comparator 450 may have been set to have the positive offset. Under the situation that the first amplifier 420, the second amplifier 430 and the latched comparator 450 have been set to have the positive offset, the comparison signal COM may be generated from the first input signal IN1 and the second input signal IN2.

When the offset setting signal OS has a second logic level, the second switch 412 and the fourth switch 414 within the input signal selector 410 may be turned on; the second input signal IN2 may be input to the gate of the first transistor T21 within the first amplifier 420 and the gate of the second transistor T32 within the second amplifier 430; and the first input signal IN1 may be input to the gate of the second transistor T22 within the first amplifier 420 and the gate of the first transistor T31 within the second amplifier 430. The second switch 422 within the first amplifier 420 may electrically couple the gates of the third transistor T23 and the fourth transistor T24 to the first amplification node AN1. The second switch 432 within the second amplifier 430 may electrically couple the gates of the third transistor T33 and the fourth transistor T34 to the third amplification node AN2. The first amplifier 420 may generate the first amplified signal pair OUT1 and OUT2 by differentially amplifying the first input signal IN1 and the second input signal IN2. The second amplifier 430 may generate the second amplified signal pair OUTB1 and OUTB2 by differentially amplifying the first input signal IN1 and the second input signal IN2.

When the offset setting signal OS has a second logic level, the third switch 443 and the fourth switch 444 within the amplified signal selector 440 may be turned on; the complementary signal OUT2 of the first output signal OUT1 may be output to the gate of the second transistor T42 within the latched comparator 450; and the complementary signal OUTB2 of the second output signal OUTB1 may be output to the gate of the first transistor T41 within the latched comparator 450. Within the latched comparator 450, the third switch 453 may electrically couple the first node N1 to the fourth node N4 and the fourth switch 454 may electrically couple the second node N2 to the third node N3. At this time, the first amplifier 420, the second amplifier 430 and the latched comparator 450 may have been set to have the negative offset. Under the situation that the first amplifier 420, the second amplifier 430 and the latched comparator 450 have been set to have the negative offset complementary to the positive offset, the comparison signal COM may be generated from the first input signal IN1 and the second input signal IN2. In an embodiment, in order to differently set the offset of the comparator 400, the way that the input signal selector 410 and the amplified signal selector 440 select the input signals and the amplified signals may be variously modified. Also, the nodes that the switches within the first amplifier 420, the second amplifier 430, and the latched comparator 450 electrically couple may be variously changed.

When the comparator 400 is provided as the first comparator 312 illustrated in FIG. 3, the first input signal IN1 may correspond to the first calibration voltage VCAL1, and the second input signal IN2 may correspond to the first reference voltage VREF1. The comparison signal COM generated by the comparator 400 may correspond to the first comparison signal COM1. When the comparator 400 is provided as the second comparator 322 illustrated in FIG. 3, the first input signal IN1 may correspond to the second calibration voltage VCAL2, and the second input signal IN2 may correspond to the second reference voltage VREF2. The comparison signal COM generated by the comparator 400 may correspond to the second comparison signal COM2.

Figure 5:
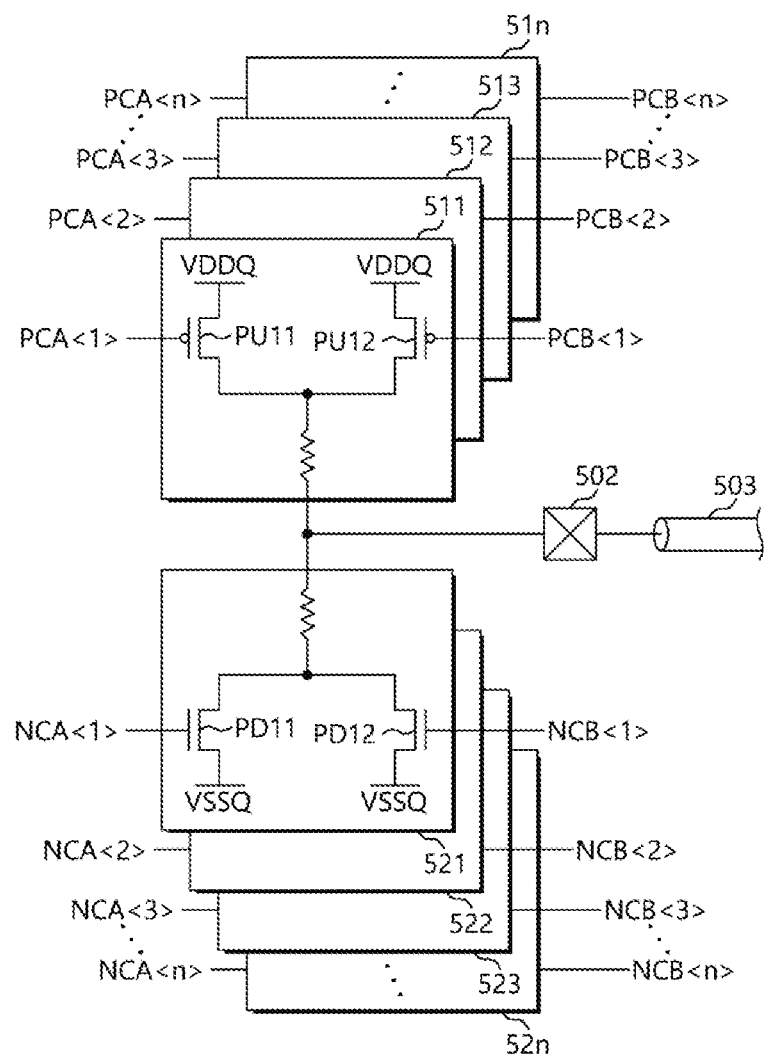
FIG. 5 is a diagram illustrating a configuration of a main driver in accordance with an embodiment.

FIG. 5 is a diagram illustrating a configuration of a main driver 500 in accordance with an embodiment. Referring to FIG. 5, the main driver 500 may receive the first calibration code and the second calibration code, and the resistance value of the main driver 500 may be set based on the first calibration code and the second calibration code. The main driver 500 may be electrically coupled to the signal transmission line 503 through a pad 502 and may set the impedance of the signal transmission line 503. The main driver 500 may include a plurality of pull-up drivers 511, 512, 513, . . . , 51n and a plurality of pull-down drivers 521, 522, 523, . . . , 52n. The number of pull-up drivers in the plurality of pull-up drivers 511, 512, 513, . . . , 51n may correspond to the number of bits of the first pull-up calibration code PCA<1:n> or the second pull-up calibration code PCB<1:n>. The number of pull-down drivers in the plurality of pull-down drivers 521, 522, 523, . . . , 52n may correspond to the number of bits of the first pull-down calibration code NCA<1:n> or the second pull-down calibration code NCB<1:n>. The plurality of pull-up drivers 511, 512, 513, . . . , 51n may be electrically coupled between the node, to which the first power voltage VDDQ is supplied, and the pad 502. The pad 502 may be electrically coupled to the signal transmission line 503. The plurality of pull-down drivers 521, 522, 523, . . . , 52n may be electrically coupled between the node, to which the second power voltage VSSQ is supplied, and the pad 502. The plurality of pull-up drivers 511, 512, 513, . . . , 51n may receive the first pull-up calibration code PCA<1:n> and the second pull-up calibration code PCB<1:n> and the resistance value of the plurality of pull-up drivers 511, 512, 513, . . . , 51n may be set based on the first pull-up calibration code PCA<1:n> and the second pull-up calibration code PCB<1:n>. The plurality of pull-down drivers 521, 522, 523, . . . , 52n may receive the first pull-down calibration code NCA<1:n> and the second pull-down calibration code NCB<1:n> and the resistance value of the plurality of pull-down drivers 521, 522, 523, . . . , 52n may be set based on the first pull-down calibration code NCA<1:n> and the second pull-down calibration code NCB<1:n>.

The first pull-up driver 511 may receive the first bits PCA<1> and PCB<1> of the first pull-up calibration code PCA<1:n> and the second pull-up calibration code PCB<1:n> and the resistance value of the first pull-up driver 511 may be set based on the first bits PCA<1> and PCB<1> of the first pull-up calibration code PCA<1:n> and the second pull-up calibration code PCB<1:n>. The second pull-up driver 512 may receive the second bits PCA<2> and PCB<2> of the first pull-up calibration code PCA<1:n> and the second pull-up calibration code PCB<1:n> and the resistance value of the second pull-up driver 512 may be set based on the second bits PCA<2> and PCB<2> of the first pull-up calibration code PCA<1:n> and the second pull-up calibration code PCB<1:n>. The third pull-up driver 513 may receive the third bits PCA<3> and PCB<3> of the first pull-up calibration code PCA<1:n> and the second pull-up calibration code PCB<1:n> and the resistance value of the third pull-up driver 513 may be set based on the third bits PCA<3> and PCB<3> of the first pull-up calibration code PCA<1:n> and the second pull-up calibration code PCB<1:n>. The n-th pull-up driver 51n may receive the n-th bits PCA<n> and PCB<n> of the first pull-up calibration code PCA<1:n> and the second pull-up calibration code PCB<1:n> and the resistance value of n-th pull-up driver may be set based on the n-th bits PCA<n> and PCB<n> of the first pull-up calibration code PCA<1:n> and the second pull-up calibration code PCB<1:n>. The first pull-down driver 521 may receive the first bits NCA<1> and NCB<1> of the first pull-down calibration code NCA<1:n> and the second pull-down calibration code NCB<1:n> and the resistance value of the first pull-down driver 521 may be set based on the first bits NCA<1> and NCB<1> of the first pull-down calibration code NCA<1:n> and the second pull-down calibration code NCB<1:n>. The second pull-down driver 522 may receive the second bits NCA<2> and NCB<2> of the first pull-down calibration code NCA<1:n> and the second pull-down calibration code NCB<1:n> and the resistance value of the second pull-down driver 522 may be set based on the second bits NCA<2> and NCB<2> of the first pull-down calibration code NCA<1:n> and the second pull-down calibration code NCB<1:n>. The third pull-down driver 523 may receive the third bits NCA<3> and NCB<3> of the first pull-down calibration code NCA<1:n> and the second pull-down calibration code NCB<1:n> and the resistance value of the third pull-down driver may be set based on the third bits NCA<3> and NCB<3> of the first pull-down calibration code NCA<1:n> and the second pull-down calibration code NCB<1:n>. The n-th pull-down driver 52n may receive the n-th bits NCA<n> and NCB<n> of the first pull-down calibration code NCA<1:n> and the second pull-down calibration code NCB<1:n> and the resistance value of the n-th pull-down driver 52n may be set based on the n-th bits NCA<n> and NCB<n> of the first pull-down calibration code NCA<1:n> and the second pull-down calibration code NCB<1:n>.

The first pull-up driver 511 may include a first pull-up transistor PU11 and a second pull-up transistor PU12. Each of the first pull-up transistor PU11 and the second pull-up transistor PU12 may be a P-channel MOS transistor. The first pull-up transistor PU11 and the second pull-up transistor PU12 may have the same size and the same ratio of width to length as each other. The first pull-up transistor PU11 may be electrically coupled between the node to which the first power voltage VDDQ is supplied and the pad 502 and may receive the first bit PCA<1> of the first pull-up calibration code PCA<1:n> at its gate. The second pull-up transistor PU12 may be coupled with the first pull-up transistor PU11 in parallel. The second pull-up transistor PU12 may be electrically coupled between the node to which the first power voltage VDDQ is supplied and the pad 502 and may receive the first bit PCB<1> of the second pull-up calibration code PCB<1:n> at its gate. The second to n-th pull-up drivers 512, 513, ..., 51n may have substantially the same configuration as the first pull-up driver 511 except that the second to n-th pull-up drivers 512, 513, ..., 51n respectively receive different bits PCA<2:n> and PCB<2:n> of the first pull-up calibration code PCA<1:n> and the second pull-up calibration code PCB<1:n>.

The first pull-down driver 521 may include a first pull-down transistor PD11 and a second pull-down transistor PD12. Each of the first pull-down transistor PD11 and the second pull-down transistor PD12 may be a N-channel MOS transistor. The first pull-down transistor PD11 and the second pull-down transistor PD12 may have the same size and the same ratio of width to length as each other. The first pull-down transistor PD11 and the second pull-down transistor PD12 may be electrically coupled to the first pull-up transistor PU11 and the second pull-up transistor PU12 in series. The first pull-down transistor PD11 may be electrically coupled between the pad 502 and the node, to which the second power voltage VSSQ is supplied, and may receive the first bit NCA<1> of the first pull-down calibration code NCA<1:n> at its gate. The second pull-down transistor PD12 may be coupled with the first pull-down transistor PD11 in parallel. The second pull-down transistor PD12 may be electrically coupled between the pad 502 and the node, to which the second power voltage VSSQ is supplied, and may receive the first bit NCB<1> of the second pull-down calibration code NCB<1:n> at its gate. The second to n-th pull-down drivers 522, 523, ..., 52n may have substantially the same configuration as the first pull-down driver 521 except that the second to n-th pull-down drivers 522, 523, ..., 52n respectively receive different bits NCA<2:n> and NCB<2:n> of the first pull-down calibration code NCA<1:n> and the second pull-down calibration code NCB<1:n>.

Described hereinafter with reference to FIGS. 3 to 5 will be the operation of the semiconductor apparatus in accordance with an embodiment of the present disclosure. During the calibration operation of the semiconductor apparatus, the calibration circuit 300 may be electrically coupled to the external reference resistance ZQ. When the calibration operation of the semiconductor apparatus is performed, the offset setting signal OS may have a first logic level. When the offset setting signal OS has a first logic level, each of the first comparator 312 and the second comparator 322 may be set to have the positive offset. The resistance value of the reference resistance leg 311 may change according to the first pull-up calibration code PCA<1:n>. The voltage level of the first calibration voltage VCAL1 may be determined according to a ratio of the resistance value of the reference resistance leg 311 and the value of the external reference resistance ZQ. Under the situation that the first comparator 312 is set to have the positive offset, the first comparator 312 may generate the first comparison signal COM1 by comparing the voltage levels of the first calibration voltage VCAL1 and the first reference voltage VREF1. The pull-up code generator 313 may change the first resistance setting code PCAL<1:n> based on the first comparison signal COM1. The pull-up register 314 may store the first resistance setting code PCAL<1:n> as the first pull-up calibration code PCA<1:n>. The resistance value of the pull-up resistance leg 321-1 may be set on a basis of the first resistance setting code PCAL<1:n>. The resistance value of the pull-down resistance leg 321-2 may change according to the second resistance setting code NCAL<1:n>. The voltage level of the second calibration voltage VCAL2 may be determined according to a ratio of the resistance values of the pull-up resistance leg 321-1 and the pull-down resistance leg 321-2. Under the situation that the second comparator 322 is set to have the positive offset, the second comparator 322 may generate the second comparison signal COM2 by comparing the voltage levels of the second calibration voltage VCAL2 and the second reference voltage VREF2. The pull-down code generator 323 may change the second resistance setting code NCAL<1:n> based on the second comparison signal COM2. The pull-down register 324 may store the second resistance setting code NCAL<1:n> as the first pull-down calibration code NCA<1:n>.

When the first pull-up calibration code PCA<1:n> and the first pull-down calibration code NCA<1:n> are stored, the offset setting signal OS may become to have a second logic level. When the offset setting signal OS has a second logic level, each of the first comparator 312 and the second comparator 322 may be set to have the negative offset complementary to the positive offset. Under the situation that the first comparator 312 is set to have the negative offset, the first comparator 312 may generate the first comparison signal COM1 by comparing the voltage levels of the first calibration voltage VCAL1 and the first reference voltage VREF1. The pull-up code generator 313 may change the first resistance setting code PCAL<1:n> based on the first comparison signal COM1. The pull-up register 314 may store the first resistance setting code PCAL<1:n> as the second pull-up calibration code PCB<1:n>. Under the situation that the second comparator 322 is set to have the negative offset, the second comparator 322 may generate the second comparison signal COM2 by comparing the voltage levels of the second calibration voltage VCAL2 and the second reference voltage VREF2. The pull-down code generator 323 may change the second resistance setting code NCAL<1:n> based on the second comparison signal COM2. The pull-down register 324 may store the second resistance setting code NCAL<1:n> as the second pull-down calibration code NCB<1:n>.

The main driver 500 may receive the first pull-up calibration code PCA<1:n> and the second pull-up calibration code PCB<1:n> from the pull-up register 314 and may receive the first pull-down calibration code NCA<1:n> and the second pull-down calibration code NCB<1:n> from the pull-down register 324. The pull-up resistance value of the main driver 500 may be set on a basis of the first pull-up calibration code PCA<1:n> and the second pull-up calibration code PCB<1:n>. The pull-down resistance value of the main driver 500 may be set on a basis of the first pull-down calibration code NCA<1:n> and the second pull-down calibration code NCB<1:n>. For example, the resistance value of the first pull-up transistor PU11 may be set to be relatively great according to the first bit PCA<1> of the first pull-up calibration code PCA<1:n>, which is generated in reflection of the positive offset. For example, the resistance value of the second pull-up transistor PU12 may be set to be relatively small according to the first bit PCB<1> of the second pull-up calibration code PCB<1:n>, which is generated in reflection of the negative offset. Because the first pull-up transistor PU11 and the second pull-up transistor PU12 are electrically coupled in parallel, sum of the resistance values of the first pull-up transistor PU11 and the second pull-up transistor PU12 may be close to a target resistance value. In an embodiment, each of the pull-up and/or pull-down drivers may include a single transistor and may set the resistance value of the transistor according to a code corresponding to an average of the first calibration code (e.g., the first pull-up calibration code PCA<1:n>) and the second calibration code (e.g., the second pull-up calibration code PCB<1:n>). However, the resistance value of a transistor nonlinearly changes and thus, when the resistance value of the transistor is set simply according to a code corresponding to an average of the first calibration code and the second calibration code, there may occur discrepancy between the set resistance value and a target resistance value. Comparing this with the main driver 500, when each of the pull-up and/or pull-down drivers includes both of a transistor, the resistance value of which is set according to the first calibration code (e.g., the first pull-up calibration code PCA<1:n>) and the second calibration code (e.g., the second pull-up calibration code PCB<1:n>), and a transistor, the resistance value of which is set according to the second calibration code (e.g., the second pull-up calibration code PCB<1:n>), the resistance value of the main driver 500 may be set close to a target resistance value.

Figure 6:
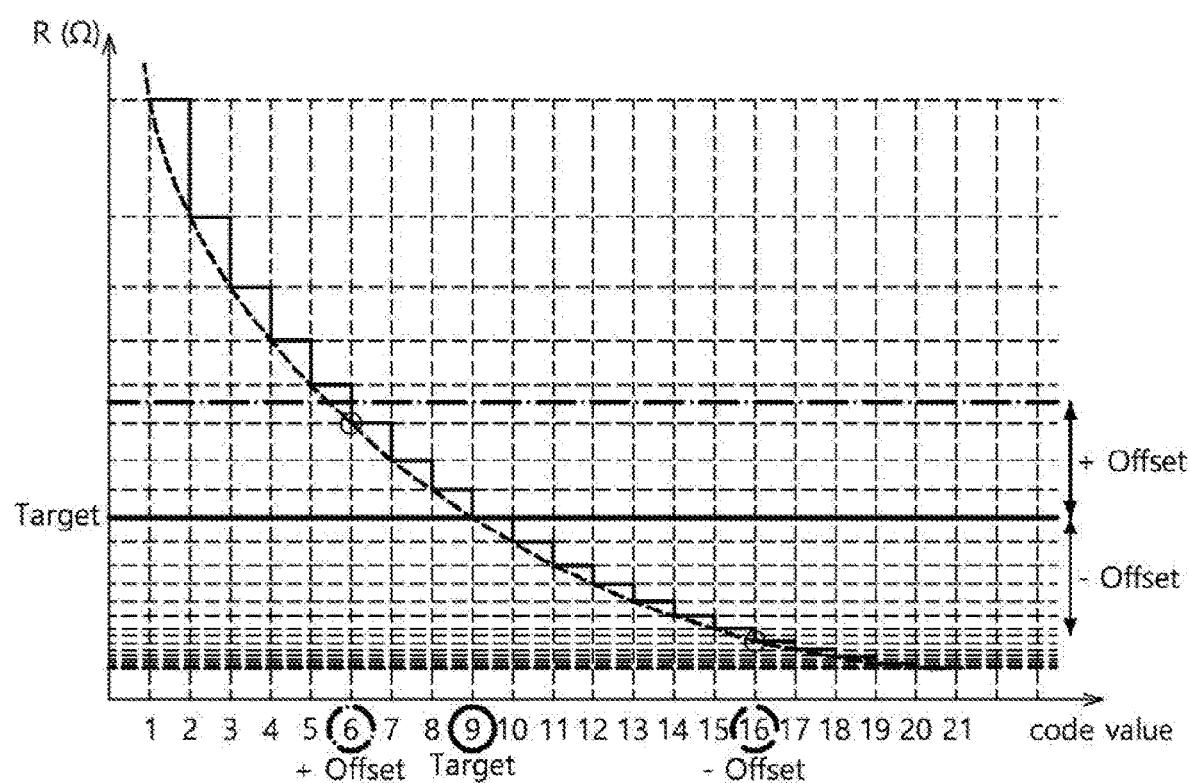
FIG. 6 is a graph illustrating a changing resistance value of a main driver with reference to a code value of a calibration code in accordance with an embodiment.

FIG. 6 is a graph illustrating change of a resistance value of a main driver with reference to a code value of a calibration code in accordance with an embodiment of the present disclosure. Referring to FIG. 6, the horizontal axis of the graph may represent a code value ("code value") of the calibration code and the vertical axis of the graph may represent the resistance value ("R") of the main driver that is set according to the calibration code. The resistance value may be represented in units of ohms (Ω). Because the resistance value of a transistor nonlinearly changes, the variance in change of the resistance value ("R") of the main driver may decrease as the code value ("code value") of the calibration code increases. Therefore, unit variance in the change of the resistance value ("R") according to the code value ("code value") within a section of the code value ("code value") that is relatively small may be greater than unit variance in the change of the resistance value ("R") according to the code value ("code value") within a section of the code value ("code value") that is relatively great. For example, it is assumed that a first calibration code of a code value '6' is generated in a situation of the positive offset ("+ Offset"); a second calibration code of a code value '16' is generated in a situation of the negative offset ("− Offset"); and a code value corresponding to a target resistance value ("Target") is '9'. In this case, there may be discrepancy between the target resistance value ("Target") and sum of the resistance values, which are set according to the first calibration code and the second calibration code. This is because the variance in the change of the resistance value according to the code value of the first calibration code is great even when the first calibration code slightly changes (such as '1') in its code value, while the variance in the change of the resistance value according to the code value of the second calibration code is small even when the second calibration code greatly changes (such as '2' or greater) in its code value. Therefore, the main driver may have the resistance value further close to the target resistance value ("Target") when somewhat reducing the code value of the second calibration code generated in a situation of the negative offset ("− Offset") and setting the resistance value ("R") of the main driver based on the first calibration code and the second calibration code that has the reduced code value.

Figure 7:
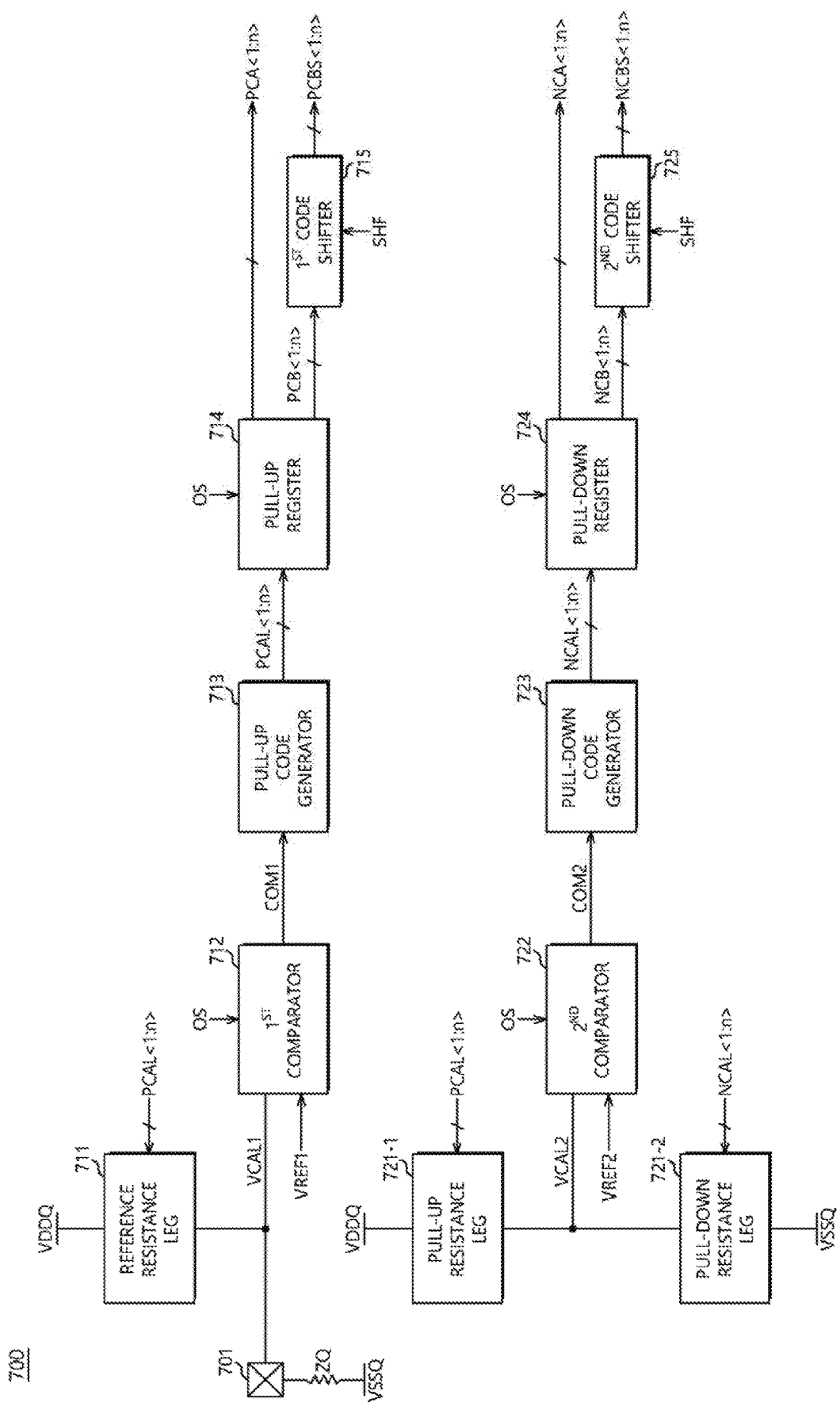
FIG. 7 is a diagram illustrating a configuration of a calibration circuit in accordance with an embodiment.

FIG. 7 is a diagram illustrating a configuration of a calibration circuit 700 in accordance with an embodiment. Referring to FIG. 7, the calibration circuit 700 may include a comparator configured to generate a comparison signal by comparing a calibration voltage and a reference voltage. When the comparator is set to have a positive offset, the calibration circuit 700 may generate the first calibration codes based on the comparison signal. When the comparator is set to have a negative offset complementary to the positive offset, the calibration circuit 700 may generate the second calibration codes based on the comparison signal. The calibration circuit 700 may generate shifted calibration codes by changing the values of the second calibration codes based on a shifting control signal SHE. The calibration circuit 700 may replace the calibration circuit 300 illustrated in FIG. 3 and the main driver 500 illustrated in FIG. 5 may be modified to the first calibration codes and the shifted calibration codes generated from the calibration circuit 700.

The calibration circuit 700 may be electrically coupled to the external reference resistance ZQ through a reference resistance pad 701. The calibration circuit 700 may include a reference resistance leg 711, a first comparator 712, a pull-up code generator 713, and a pull-up register 714. The calibration circuit 700 may generate the first pull-up calibration code PCA<1:n> and the second pull-up calibration code PCB<1:n>. The calibration circuit 700 may further include a pull-up resistance leg 721-1, a pull-down resistance leg 721-2, a second comparator 722, a pull-down code generator 723, and a pull-down register 724. The calibration circuit 700 may generate the first pull-down calibration code NCA<1:n> and the second pull-down calibration code NCB<1:n>. The calibration circuit 700 may have the same elements as the calibration circuit 300 illustrated in FIG. 3 and description for the same elements will be omitted.

The calibration circuit 700 may further include a code shifter. The code shifter may generate the shifted calibration codes by changing the code value of one between two calibration codes generated from the calibration circuit 700. The calibration circuit 700 may further include a first code shifter 715 and a second code shifter 725. The first code shifter 715 may receive the second pull-up calibration code PCB<1:n>. The first code shifter 715 may generate a shifted pull-up calibration code PCBS<1:n> by shifting the second pull-up calibration code PCB<1:n>. The first code shifter 715 may further receive the shifting control signal SHE. The first code shifter 715 may generate the shifted pull-up calibration code PCBS<1:n> by changing the second pull-up calibration code PCB<1:n> based on the shifting control signal SHE. The shifting control signal SHF may have a predetermined value and may define variation of the code value of the second pull-up calibration code PCB<1:n>. The second code shifter 725 may receive the second pull-down calibration code NCB<1:n>. The second code shifter 725 may generate a shifted pull-down calibration code NCBS<1:n> by shifting the second pull-down calibration code NCB<1:n>. The second code shifter 725 may further receive the shifting control signal SHE. The second code shifter 725 may generate the shifted pull-down calibration code NCBS<1:n> by changing the second pull-down calibration code NCB<1:n> based on the shifting control signal SHE.

The main driver 500 illustrated in FIG. 5 may be modified to receive the first pull-up calibration code PCA<1:n>, the shifted pull-up calibration code PCBS<1:n>, the first pull-down calibration code NCA<1:n> and the shifted pull-down calibration code NCBS<1:n>. The first pull-up transistor PU11 of the first pull-up driver 511 may receive the first bit PCA<1> of the first pull-up calibration code PCA<1:n> and the resistance value of the first pull-up transistor PU11 may be set based on the first bit PCA<1> of the first pull-up calibration code PCA<1:n>. The second pull-up transistor PU12 of the first pull-up driver 511 may receive the first bit PCBS<1> of the shifted pull-up calibration code PCBS<1:n> and the resistance value of the second pull-up transistor PU12 may be set based on the first bit PCBS<1> of the shifted pull-up calibration code PCBS<1:n>. The first pull-down transistor PD11 of the first pull-down driver 521 may receive the first bit NCA<1> of the first pull-down calibration code NCA<1:n> and the resistance value of the first pull-down transistor PD11 may be set based on the first bit NCA<1> of the first pull-down calibration code NCA<1:n>. The second pull-down transistor PD12 of the first pull-down driver 521 may receive the first bit NCBS<1> of the shifted pull-down calibration code NCBS<1:n> and the resistance value of the second pull-down transistor PD12 may be set based on the first bit NCBS<1> of the shifted pull-down calibration code NCBS<1:n>.

Figure 8:
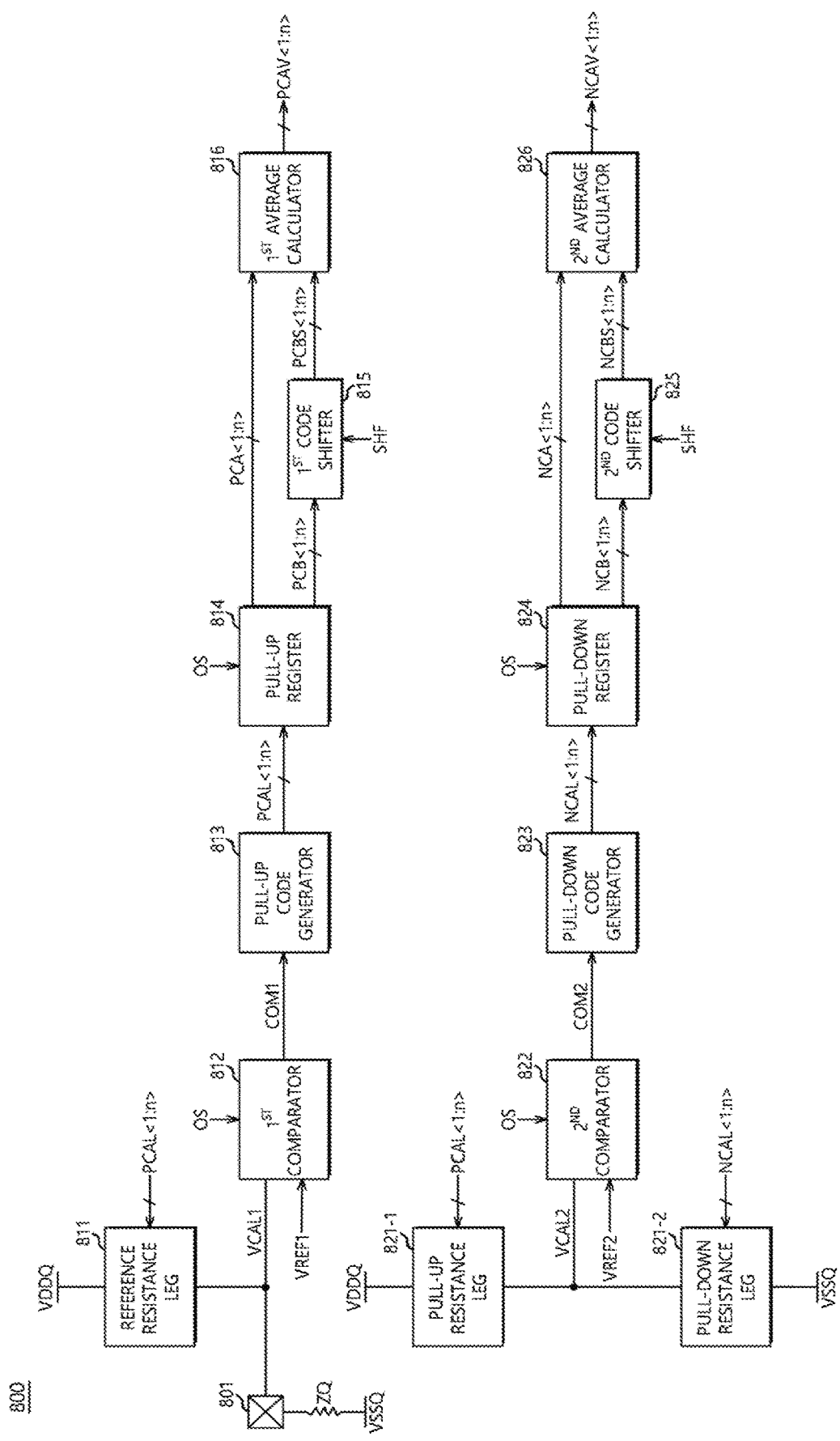
FIG. 8 is a diagram illustrating a configuration of a calibration circuit in accordance with an embodiment.

FIG. 8 is a diagram illustrating a configuration of a calibration circuit 800 in accordance with an embodiment. Referring to FIG. 8, the calibration circuit 800 may include a comparator configured to generate a comparison signal by comparing a calibration voltage and a reference voltage. When the comparator is set to have a positive offset, the calibration circuit 800 may generate the first calibration codes based on the comparison signal. When the comparator is set to have a negative offset complementary to the positive offset, the calibration circuit 800 may generate the second calibration codes based on the comparison signal. The calibration circuit 800 may generate shifted calibration codes by changing the values of the second calibration codes based on a shifting control signal SHE. The calibration circuit 800 may generate shifted calibration codes having values corresponding to averages of the values of the first calibration codes and the shifted calibration codes.

The calibration circuit 800 may be electrically coupled to the external reference resistance ZQ through a reference resistance pad 801. The calibration circuit 800 may include a reference resistance leg 811, a first comparator 812, a pull-up code generator 813, a pull-up register 814, and a first code shifter 815. The calibration circuit 800 may generate the first pull-up calibration code PCA<1:n> and the second pull-up calibration code PCB<1:n>. The calibration circuit 800 may generate shifted pull-up calibration code PCBS<1:n> which is shifted from the second pull-up calibration code PCB<1:n>. The calibration circuit 800 may further include a pull-up resistance leg 821-1, a pull-down resistance leg 821-2, a second comparator 822, a pull-down code generator 823, a pull-down register 824, and a second code shifter 825. The calibration circuit 800 may generate the first pull-down calibration code NCA<1:n> and the second pull-down calibration code NCB<1:n>. The calibration circuit 800 may generate shifted pull-down calibration code NCBS<1:n>, which is shifted from the second pull-down calibration code NCB<1:n>. The calibration circuit 700 may have the same elements as each of the calibration circuit 300 illustrated in FIG. 3 and the calibration circuit 700 illustrated in FIG. 7 and description for the same elements will be omitted.

The calibration circuit 800 may further include an average calculator. The average calculator may receive the calibration codes and the shifted calibration codes. The average calculator may generate average calibration codes having average values of the calibration codes and the shifted calibration codes. The calibration circuit 800 may further include a first average calculator 816 and a second average calculator 826. The first average calculator 816 may receive the first pull-up calibration code PCA<1:n> and the shifted pull-up calibration code PCBS<1:n>. The first average calculator 816 may calculate an average of the code values of the first pull-up calibration code PCA<1:n> and the shifted pull-up calibration code PCBS<1:n>. The first average calculator 816 may generate an average pull-up calibration code PCAV<1:n> having a code value corresponding to the average. The second average calculator 826 may receive the first pull-down calibration code NCA<1:n> and the shifted pull-down calibration code NCBS<1:n>. The second average calculator 826 may calculate an average of the code values of the first pull-down calibration code NCA<1:n> and the shifted pull-down calibration code NCBS<1:n>. The second average calculator 826 may generate an average pull-down calibration code NCAV<1:n> having a code value corresponding to the average.

Figure 9:
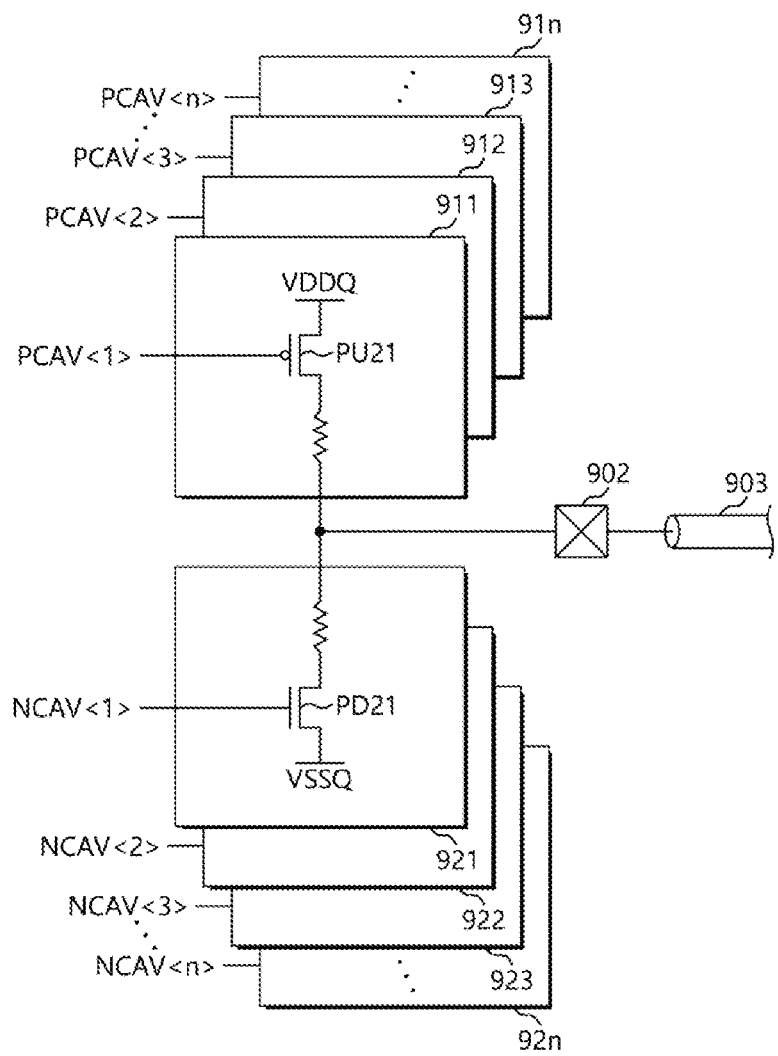
FIG. 9 is a diagram illustrating a configuration of a main driver in accordance with an embodiment.

When the semiconductor apparatus adopts the calibration circuit 800, the main driver may be configured as illustrated in FIG. 9. FIG. 9 is a diagram illustrating a configuration of a main driver 900 in accordance with an embodiment. Referring to FIG. 9, the main driver 900 may receive the average calibration codes and the resistance value of the main driver 900 may be set based on the average calibration codes. The main driver 900 may be electrically coupled to the signal transmission line 903 through a pad 902 and may set the impedance of the signal transmission line 903. The main driver 900 may include a plurality of pull-up drivers 911, 912, 913, . . . , 91n and a plurality of pull-down drivers 921, 922, 923, . . . , 92n. The number of pull-up drivers in the plurality of pull-up drivers 911, 912, 913, . . . , 91n may correspond to a number of bits of the average pull-up calibration code PCAV<1:n>. The number of pull-down drivers in the plurality of pull-down drivers 921, 922, 923, . . . , 92n may correspond to a number of bits of the average pull-down calibration code NCAV<1:n>. The plurality of pull-up drivers 911, 912, 913, . . . , 91n may be electrically coupled between the node, to which the first power voltage VDDQ is supplied, and the pad 902. The plurality of pull-down drivers 921, 922, 923, . . . , 92n may be electrically coupled between the node, to which the second power voltage VSSQ is supplied, and the pad 902. The plurality of pull-up drivers 911, 912, 913, . . . , 91n may receive the average pull-up calibration code PCAV<1:n> and the resistance value of the plurality of pull-up drivers 911, 912, 913, . . . , 91n may be set based on the average pull-up calibration code PCAV<1:n>. The plurality of pull-down drivers 921, 922, 923, . . . , 92n may receive the average pull-down calibration code NCAV<1:n> and the resistance value of the plurality of pull-down drivers 921, 922, 923, . . . , 92n may be set based on the average pull-down calibration code NCAV<1:n>.

The first pull-up driver 911 may receive the first bit PCAV<1> of the average pull-up calibration code PCAV<1:n> and the resistance value of the first pull-up driver 911 may be set based on the first bit PCAV<1> of the average pull-up calibration code PCAV<1:n>. The second pull-up driver 912 may receive the second bit PCAV<2> of the average pull-up calibration code PCAV<1:n> and the resistance value of the second pull-up driver 912 may be set based on the second bit PCAV<2> of the average pull-up calibration code PCAV<1:n>. The third pull-up driver 913 may receive the third bit PCAV<3> of the average pull-up calibration code PCAV<1:n> and the resistance value of the third pull-up driver 913 may be set based on the third bit PCAV<3> of the average pull-up calibration code PCAV<1:n>. The n-th pull-up driver 91n may receive the n-th bit PCAV<n> of the average pull-up calibration code PCAV<1:n> and the resistance value of the n-th pull-up driver 91n may be set based on the n-th bit PCAV<n> of the average pull-up calibration code PCAV<1:n>. The first pull-down driver 921 may receive the first bit NCAV<1> of the average pull-down calibration code NCAV<1:n> and the resistance value of the first pull-down driver 921 may be set based on the first bit NCAV<1> of the average pull-down calibration code NCAV<1:n>. The second pull-down driver 922 may receive the second bit NCAV<2> of the average pull-down calibration code NCAV<1:n> and the resistance value of the second pull-down driver 922 may be set based on the second bit NCAV<2> of the average pull-down calibration code NCAV<1:n>. The third pull-down driver 923 may receive the third bit NCAV<3> of the average pull-down calibration code NCAV<1:n> and the resistance value of the third pull-down driver 923 may set based on the third bit NCAV<3> of the average pull-down calibration code NCAV<1:n>. The n-th pull-down driver 92n may receive the n-th bit NCAV<n> of the average pull-down calibration code NCAV<1:n> and the resistance value of the n-th pull-down driver 92n may be set based on the n-th bit NCAV<n> of the average pull-down calibration code NCAV<1:n>.

The first pull-up driver 911 may include a pull-up transistor PU21. The pull-up transistor PU21 may be a P-channel MOS transistor. The pull-up transistor PU21 may be electrically coupled between the node, to which the first power voltage VDDQ is supplied, and the pad 902 and may receive the first bit PCAV<1> of the average pull-up calibration code PCAV<1:n> at its gate. The second to n-th pull-up drivers 912, 913, . . . , 91n may have substantially the same configuration as the first pull-up driver 911 except that the second to n-th pull-up drivers 912, 913, . . . , 91n respectively receive different bits PCAV<2:n> of the average pull-up calibration code PCAV<1:n>. The size of the pull-up transistor PU21 may be greater than each of the first pull-up transistor PU11 and the second pull-up transistor PU12 illustrated in FIG. 5. For example, the size and/or the ratio of width to length of the pull-up transistor PU21 may be twice the size and/or the ratio of width to length of each of the first pull-up transistor PU11 and the second pull-up transistor PU12.

The first pull-down driver 921 may include a pull-down transistor PD21. The pull-down transistor PD21 may be a N-channel MOS transistor. The pull-down transistor PD21 may be electrically coupled to the pull-up transistor PU21 in series. The pull-down transistor PD21 may be electrically coupled between the pad 902 and the node, to which the second power voltage VSSQ is supplied, and may receive the first bit NCAV<1> of the average pull-down calibration code NCAV<1:n> at its gate. The second to n-th pull-down drivers 922, 923, . . . , 92n may have substantially the same configuration as the first pull-down driver 921 except that the second to n-th pull-down drivers 922, 923, . . . , 92n respectively receive different bits NCAV<2:n> of the average pull-down calibration code NCAV<1:n>. The size of the pull-down transistor PD21 may be greater than each of the first pull-down transistor PD11 and the second pull-down transistor PD12 illustrated in FIG. 5. For example, the size and/or the ratio of width to length of the pull-down transistor PD21 may be twice the size and/or the ratio of width to length of each of the first pull-down transistor PD11 and the second pull-down transistor PD12.

While various embodiments have been described above, it will be understood by those skilled in the art that the described embodiments serve as examples only. Accordingly, the semiconductor apparatus and the operating method thereof, which have been described herein, should not be limited based on the described embodiments.

What is claimed is:

1. A semiconductor apparatus comprising:
a calibration circuit including a comparator configured to compare a calibration voltage and a reference voltage to generate a comparison signal, and configured to generate a first calibration code based on the comparison signal when the comparator is set to have a positive offset and generate a second calibration code based on the comparison signal when the comparator is set to have a negative offset complementary to the positive offset; and
a main driver including a plurality of drivers coupled in parallel, configured to set a resistance value of the plurality of drivers based on the first calibration code and the second calibration code.

2. The semiconductor apparatus of claim 1,
wherein the comparator includes:
a first input node;
a second input node;
a third input node;
a fourth input node;
first differential output nodes configured to output a first amplified signal pair by differentially amplifying signals input to the first input node and the second input node; and
second differential output nodes configured to output a second amplified signal pair by differentially amplifying signals input to the third input node and the fourth input node, wherein, when an offset setting signal has a first logic level, the comparator is configured to receive the calibration voltage through the first input node and the fourth input node, receive the reference voltage through the second input node and the third input node, and generate the comparison signal based on one between the first amplified signal pair and one between the second amplified signal pair, and wherein, when the offset setting signal has a second logic level, the comparator is configured to receive the reference voltage through the first input node and the fourth input node, receive the calibration voltage through the second input node and the third input node, and generate the comparison signal based on the other one between the first amplified signal pair and the other one between the second amplified signal pair.

3. The semiconductor apparatus of claim 1, wherein the calibration circuit includes:
a reference resistance leg coupled to an external reference resistance and configured to generate the calibration voltage based on a resistance setting code;
a code generator configured to generate the resistance setting code based on the comparison signal; and
a register configured to store the resistance setting code as the first calibration code when the comparator is set to have the positive offset and store the resistance setting code as the second calibration code when the comparator is set to have the negative offset.

4. The semiconductor apparatus of claim 3, wherein the register is configured to:
store the resistance setting code as the first calibration code when the offset setting signal has a first logic level; and
store the resistance setting code as the second calibration code when the offset setting signal has a second logic level.

5. The semiconductor apparatus of claim 1,
wherein each of the plurality of drivers comprises a first transistor and a second transistor coupled with the first transistor in parallel,
wherein a resistance value of each of the first transistors of the plurality of drivers is set based on the first calibration code, and
wherein a resistance value of each of the second transistors of the plurality of drivers is set based on the second calibration code.

6. A semiconductor apparatus comprising:
a calibration circuit including a comparator configured to compare a calibration voltage and a reference voltage to generate a comparison signal, and configured to generate a first calibration code based on the comparison signal when the comparator is set to have a positive offset, generate a second calibration code based on the comparison signal when the comparator is set to have a negative offset complementary to the positive offset, and generate a shifted calibration code by changing a value of the second calibration code based on a shifting control signal; and
a main driver configured to set a resistance value of the main driver based on the first calibration code and the shifted calibration code.

7. The semiconductor apparatus of claim 6,
wherein the comparator includes:
a first input node;
a second input node;
a third input node;
a fourth input node;
first differential output nodes configured to output a first amplified signal pair by differentially amplifying signals input to the first input node and the second input node; and
second differential output nodes configured to output a second amplified signal pair by differentially amplifying signals input to the third input node and the fourth input node, wherein, when an offset setting signal has a first logic level, the comparator is configured to receive the calibration voltage through the first input node and the fourth input node, receive the reference voltage through the second input node and the third input node and generate the comparison signal based on one between the first amplified signal pair and one between the second amplified signal pair, and wherein, when the offset setting signal has a second logic level, the comparator is configured to receive the reference voltage through the first input node and the fourth input node, receive the calibration voltage through the second input node and the third input node and generate the comparison signal based on the other one between the first amplified signal pair and the other one between the second amplified signal pair.

8. The semiconductor apparatus of claim 6, wherein the calibration circuit further includes:
a reference resistance leg coupled to an external reference resistance and configured to generate the calibration voltage based on a resistance setting code;
a code generator configured to generate the resistance setting code based on the comparison signal;
a register configured to store the resistance setting code as the first calibration code when the comparator is set to have the positive offset and store the resistance setting code as the second calibration code when the comparator is set to have the negative offset; and
a code shifter configured to generate the shifted calibration code by changing the value of the second calibration code based on the shifting control signal.

9. The semiconductor apparatus of claim 8, wherein the register is configured to:
store the resistance setting code as the first calibration code when the offset setting signal has a first logic level; and
store the resistance setting code as the second calibration code when the offset setting signal has a second logic level.

10. The semiconductor apparatus of claim 6,
wherein the main driver includes a plurality of drivers, each comprising a first transistor and a second transistor coupled with the first transistor in parallel,
wherein a resistance value of each of the first transistors of the plurality of drivers is set based on the first calibration code, and
wherein a resistance value of each of the second transistors of the plurality of drivers is set based on the shifted calibration code.

11. A semiconductor apparatus comprising:
a calibration circuit including a comparator configured to compare a calibration voltage and a reference voltage to generate a comparison signal, wherein the calibration circuit is configured to generate a first calibration code based on the comparison signal when the comparator is set to have a positive offset, generate a second calibration code based on the comparison signal when the comparator is set to have a negative offset complementary to the positive offset, generate a shifted calibration code by changing a value of the second calibration code based on a shifting control signal, and generate an average calibration code having a code value corresponding to an average of code values of the first calibration code and the shifted calibration code; and a main driver configured to set a resistance value of the main driver based on the average calibration code.

12. The semiconductor apparatus of claim 11, wherein the comparator includes:
   a first input node;
   a second input node;
   a third input node;
   a fourth input node;
   first differential output nodes configured to output a first amplified signal pair by differentially amplifying signals input to the first input node and the second input node; and
   second differential output nodes configured to output a second amplified signal pair by differentially amplifying signals input to the third input node and the fourth input node,
wherein, when an offset setting signal has a first logic level, the comparator is configured to receive the calibration voltage through the first input node and the fourth input node, receive the reference voltage through the second input node and the third input node, and generate the comparison signal based on one between the first amplified signal pair and one between the second amplified signal pair, and
wherein, when the offset setting signal has a second logic level, the comparator is configured to receive the reference voltage through the first input node and the fourth input node, receive the calibration voltage through the second input node and the third input node, and generate the comparison signal based on the other one between the first amplified signal pair and the other one between the second amplified signal pair.

13. The semiconductor apparatus of claim 11, wherein the calibration circuit further includes:
   a reference resistance leg coupled to an external reference resistance and configured to generate the calibration voltage based on a resistance setting code;
   a code generator configured to generate the resistance setting code based on the comparison signal;
   a register configured to store the resistance setting code as the first calibration code when the comparator is set to have the positive offset and store the resistance setting code as the second calibration code when the comparator is set to have the negative offset;
   a code shifter configured to generate the shifted calibration code by changing the value of the second calibration code based on the shifting control signal; and
   an average calculator configured to generate the average calibration code having a code value corresponding to the average of code values of the first calibration code and the shifted calibration code.

14. The semiconductor apparatus of claim 13, wherein the register is configured to:
   store the resistance setting code as the first calibration code when the offset setting signal has a first logic level; and
   store the resistance setting code as the second calibration code when the offset setting signal has a second logic level.

15. The semiconductor apparatus of claim 11,
wherein the main driver includes a plurality of drivers, and
wherein a resistance value of each of the plurality of drivers is set based on the average calibration code.

16. A semiconductor apparatus comprising:
   a calibration circuit including a comparator configured to compare a calibration voltage and a reference voltage to generate a comparison signal, and configured to generate a first pull-up calibration code based on the comparison signal when the comparator is set to have a positive offset and generate a second pull-up calibration code based on the comparison signal when the comparator is set to have a negative offset complementary to the positive offset; and
   a main driver configured to set a pull-up resistance value of the main driver based on the first pull-up calibration code and the second pull-up calibration code.

17. A semiconductor apparatus comprising:
   a calibration circuit including a comparator configured to compare a calibration voltage and a reference voltage to generate a comparison signal, and configured to generate a first pull-down calibration code based on the comparison signal when the comparator is set to have a positive offset and generate a second pull-down calibration code based on the comparison signal when the comparator is set to have a negative offset complementary to the positive offset; and
   a main driver configured to set a pull-down resistance value of the main driver based on the first pull-down calibration code and the second pull-down calibration code.

18. A semiconductor apparatus comprising:
   a calibration circuit including a first comparator configured to compare a first calibration voltage and a first reference voltage to generate a first comparison signal and a second comparator configured to compare a second calibration voltage and a second reference voltage to generate a second comparison signal, configured to generate a first pull-up calibration code based on the first comparison signal when the first comparator is set to have a positive offset and generate a second pull-up calibration code based on the first comparison signal when the first comparator is set to have a negative offset complementary to the positive offset, and configured to generate a first pull-down calibration code based on the first comparison signal when the second comparator is set to have a positive offset and generate a second pull-down calibration code based on the second comparison signal when the second comparator is set to have a negative offset complementary to the positive offset; and
   a main driver configured to set a pull-up resistance value of the main driver based on the first pull-up calibration code and the second pull-up calibration code and configured to set a pull-down resistance value of the main driver based on the first pull-down calibration code and the second pull-down calibration code.

* * * * *